(12) United States Patent
Kobayashi et al.

(10) Patent No.: US 10,396,017 B2
(45) Date of Patent: Aug. 27, 2019

(54) LEAD FRAME

(71) Applicant: SHINKO ELECTRIC INDUSTRIES CO., LTD., Nagano-shi, Nagano (JP)

(72) Inventors: Konosuke Kobayashi, Nagano (JP); Koji Ato, Nagano (JP); Makoto Takeuchi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/975,157

(22) Filed: May 9, 2018

(65) Prior Publication Data
US 2018/0331023 A1 Nov. 15, 2018

(30) Foreign Application Priority Data
May 15, 2017 (JP) .................. 2017-096152

(51) Int. Cl.
H01L 23/49 (2006.01)
H01L 23/495 (2006.01)
H01L 23/00 (2006.01)
H01L 21/48 (2006.01)

(52) U.S. Cl.
CPC .... *H01L 23/49548* (2013.01); *H01L 21/4828* (2013.01); *H01L 23/49513* (2013.01); *H01L 23/49541* (2013.01); *H01L 23/49582* (2013.01); *H01L 24/48* (2013.01); *H01L 2224/16245* (2013.01); *H01L 2224/32245* (2013.01); *H01L 2224/45144* (2013.01); *H01L 2224/45147* (2013.01); *H01L 2224/48091* (2013.01); *H01L 2224/48247* (2013.01); *H01L 2224/73265* (2013.01); *H01L 2924/181* (2013.01)

(58) Field of Classification Search
CPC ......... H01L 23/49548; H01L 23/49582; H01L 24/48; H01L 23/49513
See application file for complete search history.

(56) References Cited

U.S. PATENT DOCUMENTS

| 5,637,914 A * | 6/1997 | Tanaka .................. H01L 21/565 257/666 |
| 2003/0111717 A1* | 6/2003 | Ito ....................... H01L 21/4821 257/678 |
| 2004/0046240 A1* | 3/2004 | Hasebe ............... H01L 21/4842 257/678 |

(Continued)

FOREIGN PATENT DOCUMENTS

| JP | 2014-212207 | 11/2014 |
| JP | 2014-212210 | 11/2014 |

*Primary Examiner* — Charles D Garber
*Assistant Examiner* — S M Sohel Imtiaz
(74) *Attorney, Agent, or Firm* — Rankin, Hill & Clark LLP

(57) ABSTRACT

A lead frame includes a frame part, a lead extending inward from the frame part and having a front surface and a back surface, and an external connection terminal formed at a part of the lead in an extension direction and protruding from the back surface of the lead. The lead includes a pentagonal shape in a cross-section where the front surface of the lead faces upward, the pentagonal shape having a quadrangular main body part and a triangular protrusion protruding from a lower surface of the main body part. A width of a lower end of the main body part is smaller than a width of an upper end of the main body part.

20 Claims, 31 Drawing Sheets (BACK SURFACE SIDE)

(56) References Cited

U.S. PATENT DOCUMENTS

| | | | |
|---|---|---|---|
| 2007/0034994 A1* | 2/2007 | Choi | H01L 23/4951 257/666 |
| 2014/0319663 A1* | 10/2014 | Shibasaki | H01L 21/4828 257/670 |
| 2016/0189978 A1 | 6/2016 | Shibasaki et al. | |
| 2017/0077011 A1 | 3/2017 | Shibasaki et al. | |

* cited by examiner (BACK SURFACE SIDE)

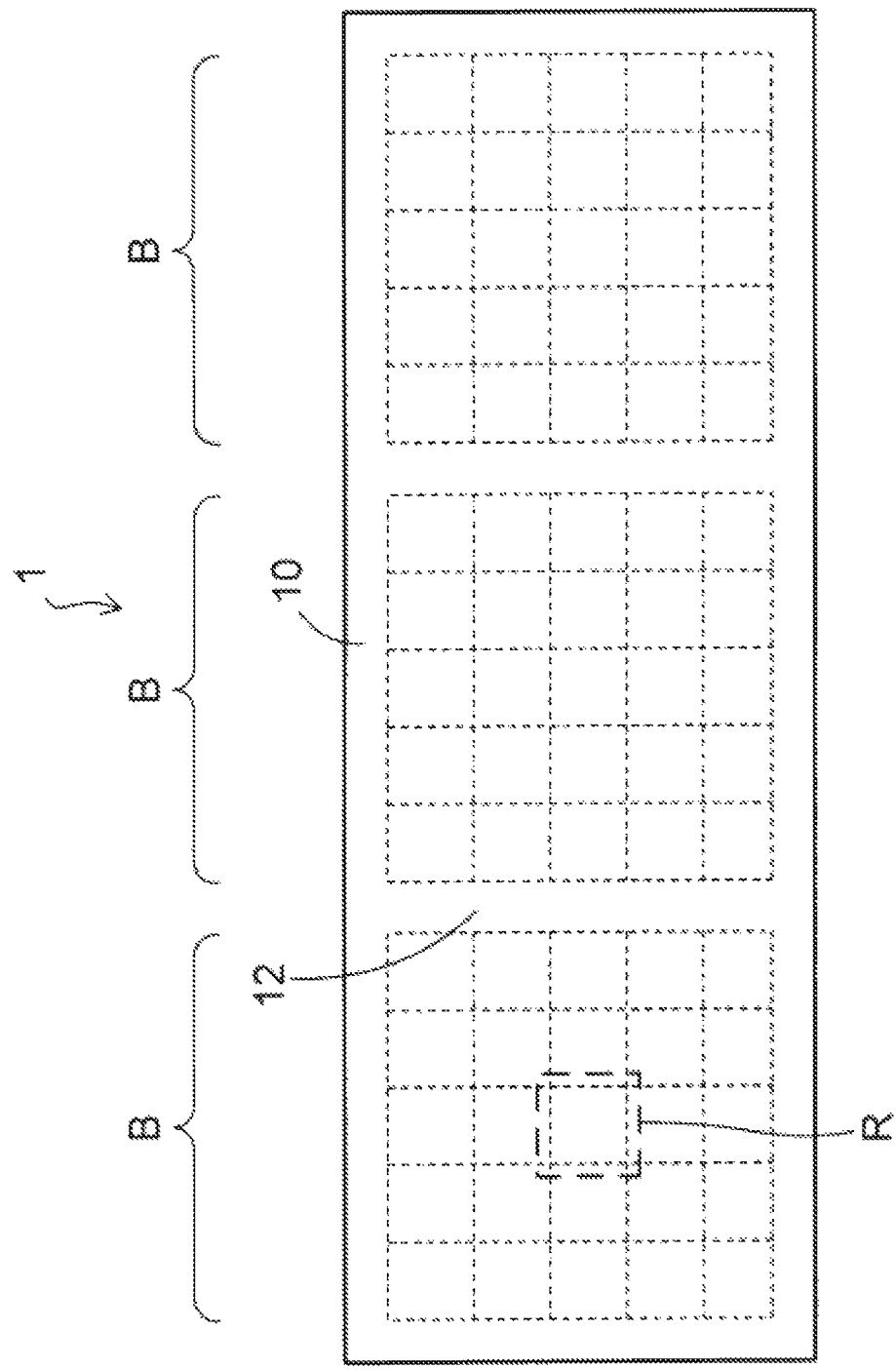

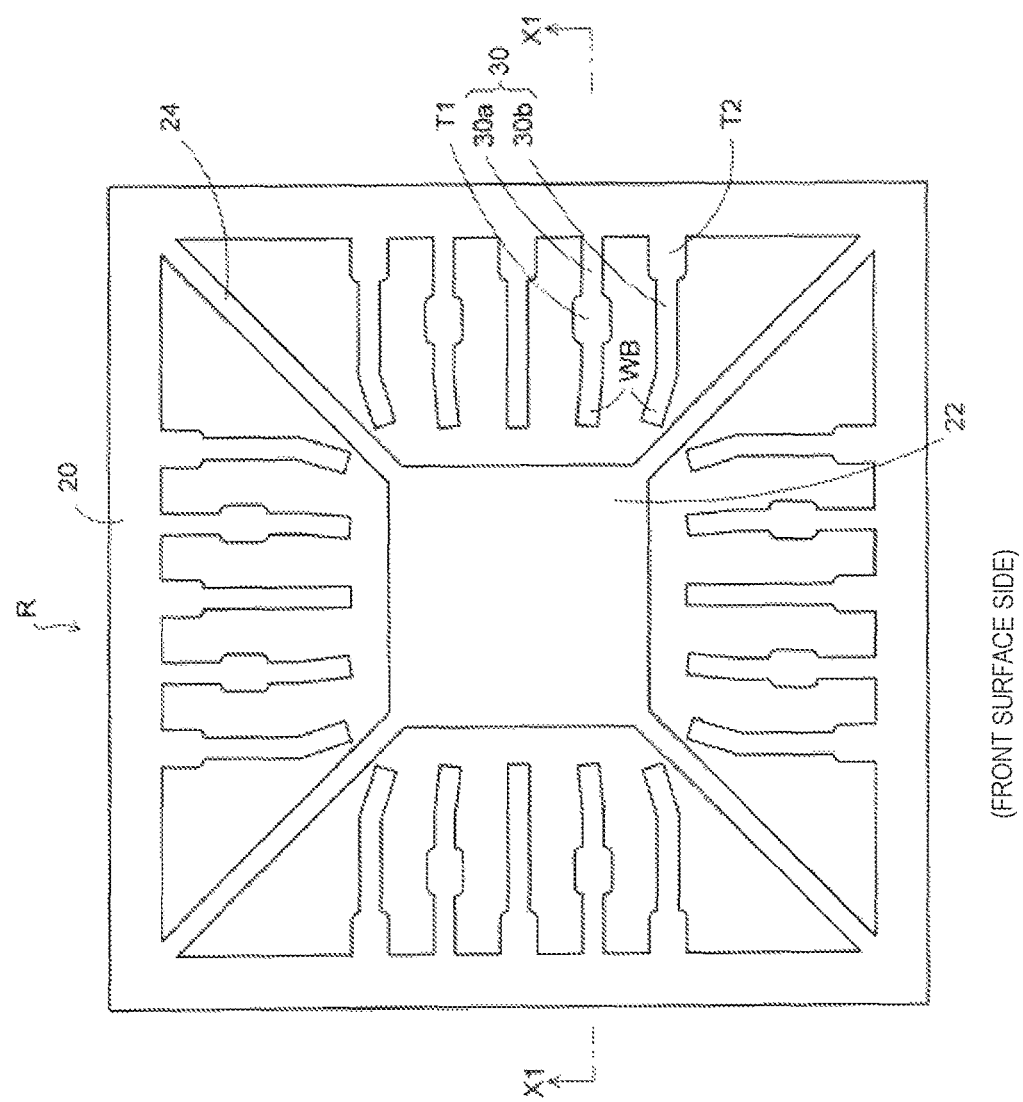

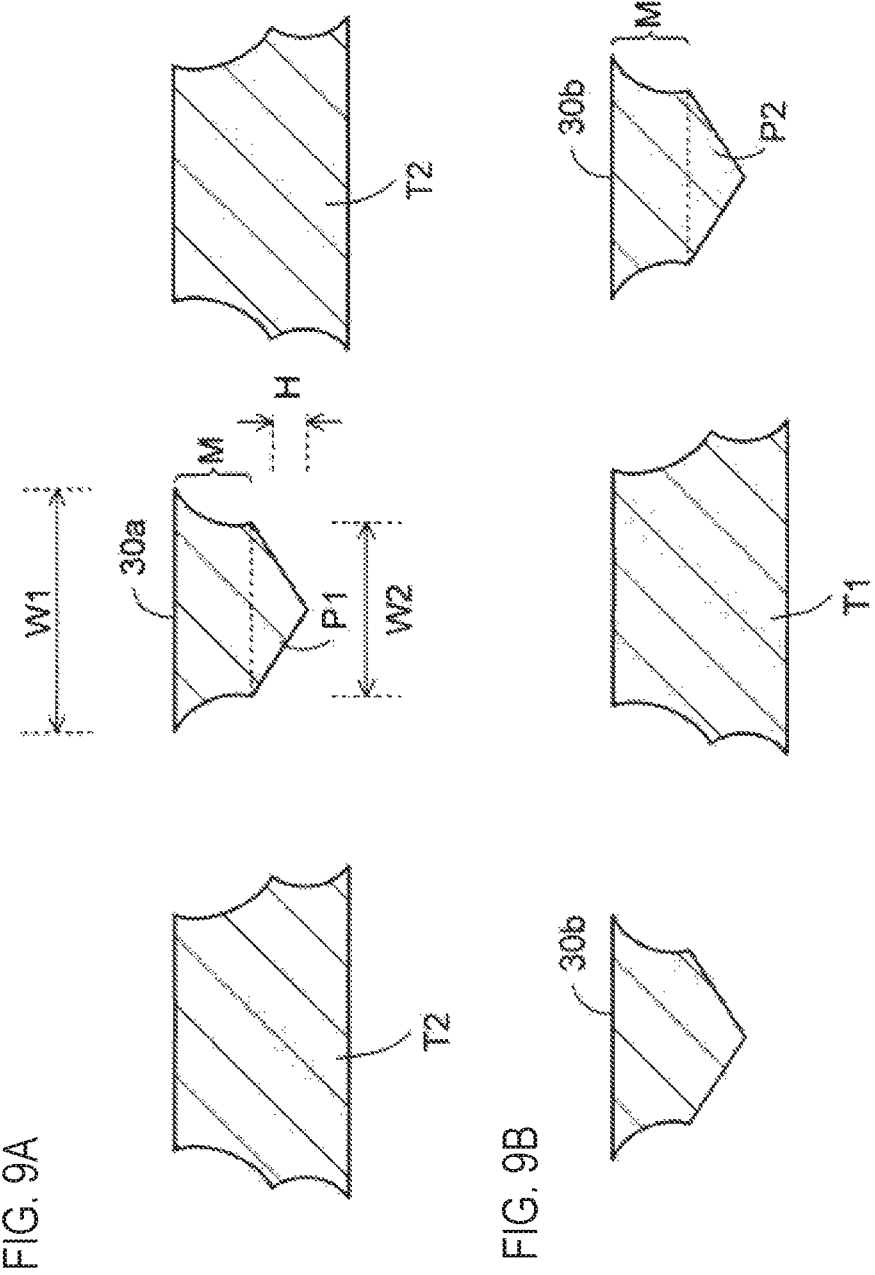

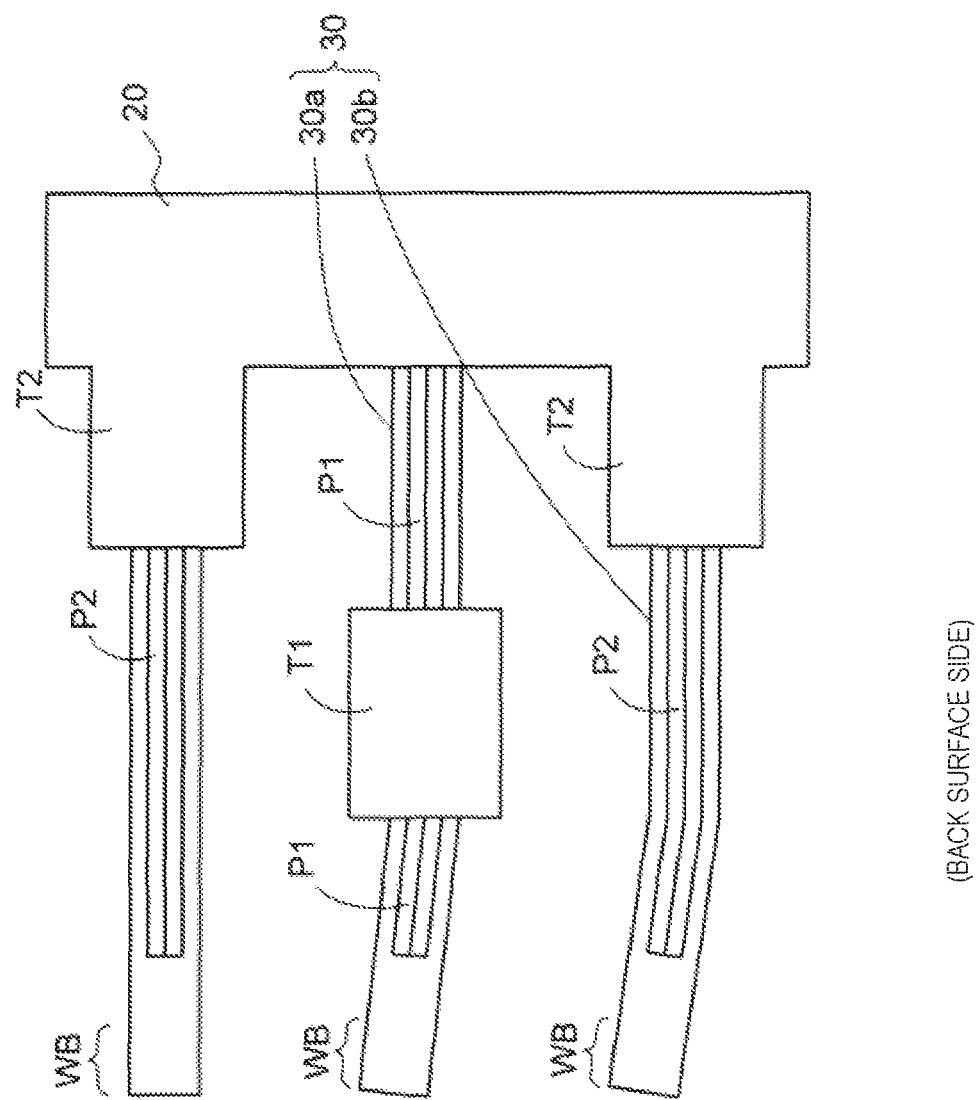

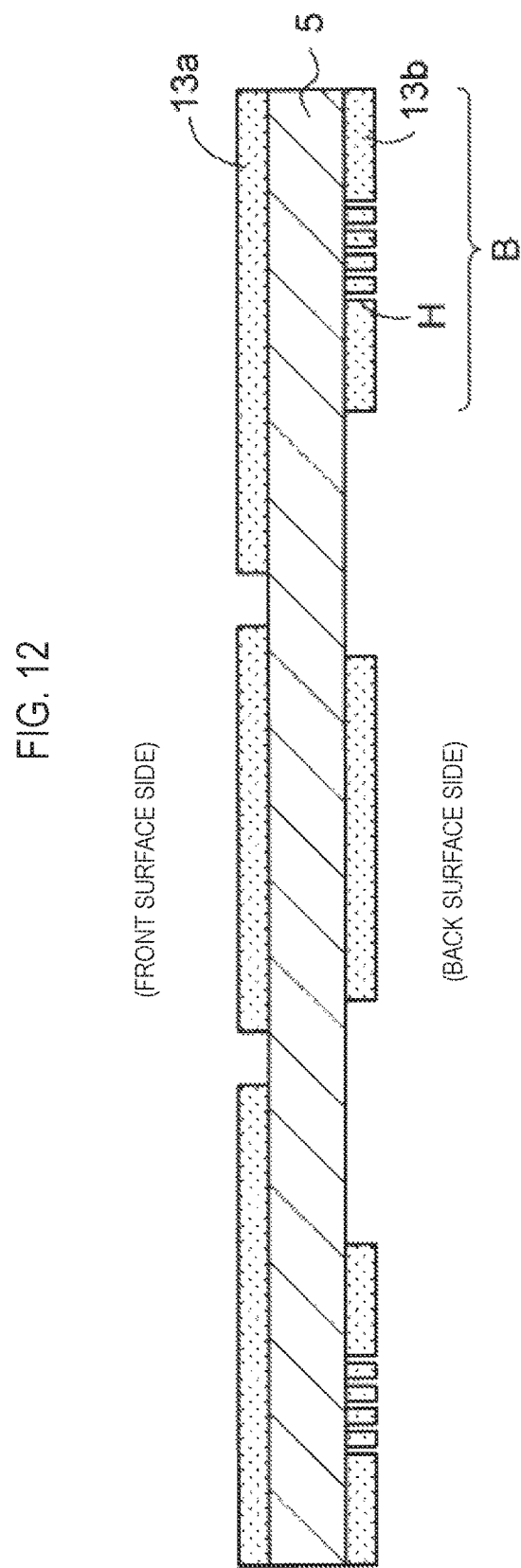

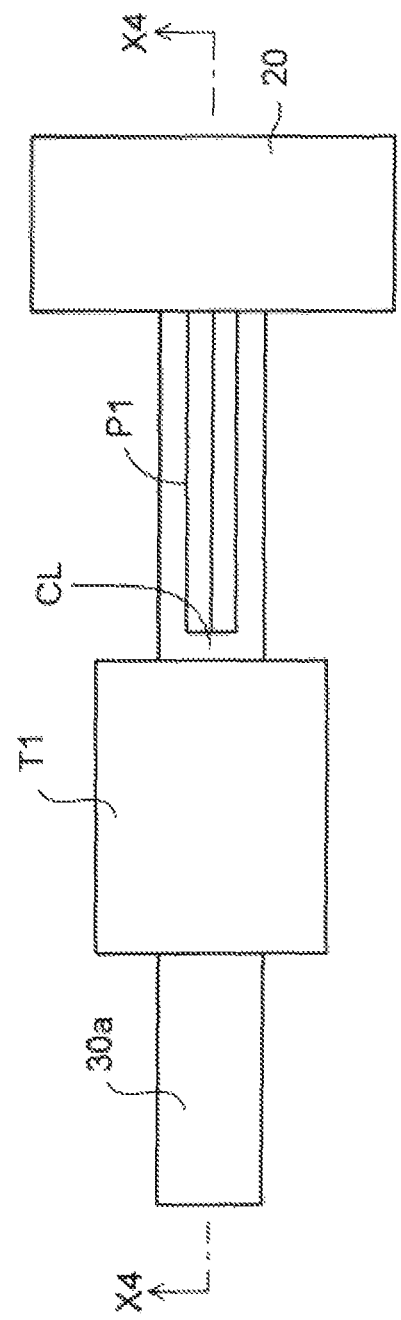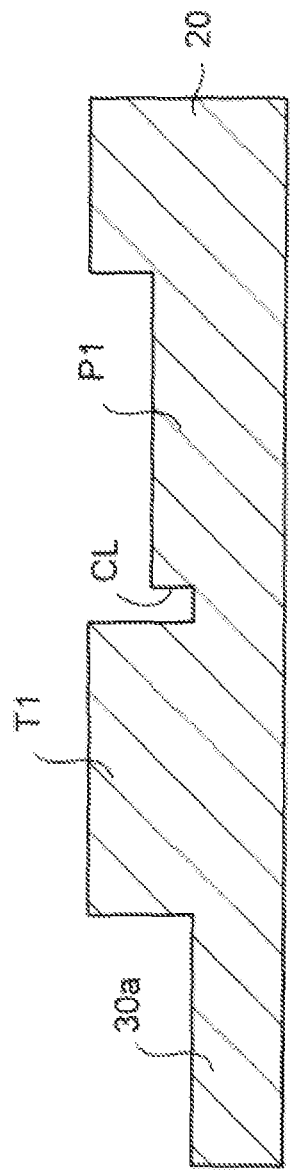

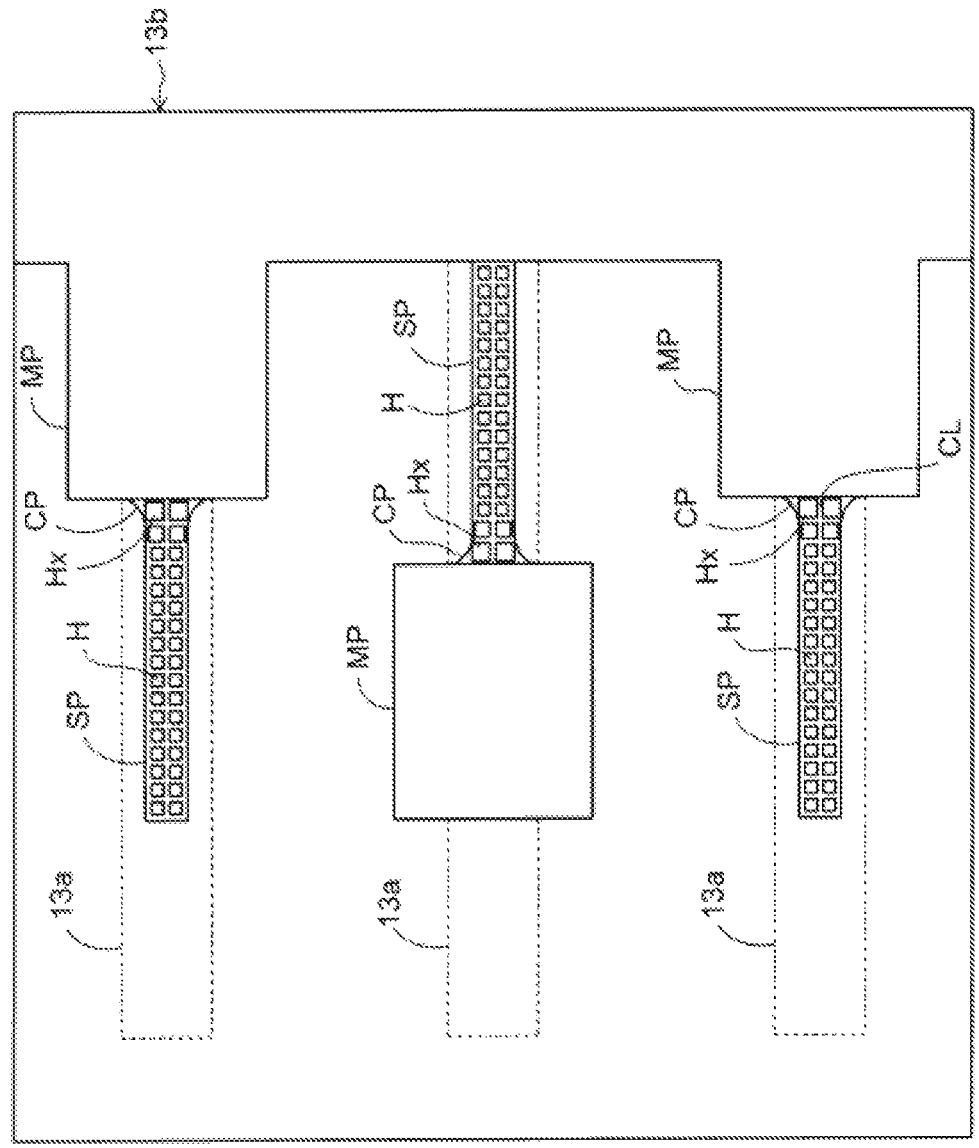

LEAD FRAME

CROSS-REFERENCE TO RELATED APPLICATION

The present application claims priority from Japanese Patent Application No. 2017-096152 filed on May 15, 2017, the entire content of which is incorporated herein by reference.

BACKGROUND

Technical Field

The present disclosure relates to a lead frame.

Related Art

In the related art, a lead frame for mounting thereon electronic components such as semiconductor chips has been known. In such a lead frame, a semiconductor chip mounted on a die pad is connected to a surrounding lead by a wire, and the semiconductor chip and the wire are sealed by a sealing resin.
Patent Document 1: JP-A-2014-212207
Patent Document 2: JP-A-2014-212210

As described later in paragraphs of preliminary matters, there is a lead frame where a lead is formed by half etching a metal plate. In such a lead frame, since a back surface of the lead is formed as a concave surface, when a thickness of the lead is thinned, a cross-sectional area of the lead is considerably reduced.

For this reason, when an external force is applied to the lead, the lead is likely to be deformed, so that it is difficult to reliably connect the lead of the lead frame and the semiconductor chip by the wire.

SUMMARY

Exemplary embodiments of the present disclosure provide a lead frame having a novel structure capable of preventing deformation of a lead.

A lead frame according to the present disclosure comprises:
 a frame part;
 a lead extending inward from the frame part and having a front surface and a back surface; and
 an external connection terminal formed at a part of the lead in an extension direction and protruding from the back surface of the lead,
 wherein the lead includes a pentagonal shape in a cross-section where the front surface of the lead faces upward, the pentagonal shape having a quadrangular main body part and a triangular protrusion protruding from a lower surface of the main body part, and
 a width of a lower end of the main body part is smaller than a width of an upper end of the main body part.

A manufacturing method of a lead frame according to the present disclosure comprises:
 preparing a metal plate; and
 etching the metal plate to form a frame part, a lead extending inward from the frame part and having a front surface and a back surface, and an external connection terminal arranged at a part of the lead in an extension direction and protruding from the back surface of the lead,
 wherein the lead includes a pentagonal shape in a cross-section where the front surface of the lead faces upward, the pentagonal shape having a quadrangular main body part and a triangular protrusion protruding from a lower surface of the main body part, and
 a width of a lower end of the main body part is set to be smaller than a width of an upper end of the main body part.

According to the present disclosure, the lead frame includes the lead extending inward from the frame part, and the external connection terminal formed at a part of the lead in the extension direction thereof and protruding from the back surface of the lead.

The cross-sectional shape where the front surface of the lead faces upward is the pentagonal shape having the quadrangular main body part and the triangular protrusion protruding from the lower surface of the main body part, and the width of the lower end of the main body part is set to be smaller than the width of the upper end.

Since the lead has the protrusion protruding downward from the back surface, it is possible to increase the strength of the lead, as compared to a structure where the back surface of the lead has a concave shape, so that the deformation of the lead due to the external force is prevented.

Also, the width of the lower end of the lead of which the cross-sectional shape is the pentagonal shape is set to be smaller than the width of the upper end, so that the cross-sectional area is reduced. Accordingly, it is possible to prevent a burr from being generated when cutting the lead.

BRIEF DESCRIPTION OF THE DRAWINGS

FIG. 5 is a plan view depicting a lead frame of an exemplary embodiment.

FIG. 6 is a partial plan view depicting the lead frame of one product region of FIG. 5, as seen from a front surface side.

FIG. 9A is a sectional view taken along a line II-II of FIG. 8, and FIG. 9B is a sectional view taken along a line III-III of FIG. 8.

FIG. 10 is a partially enlarged plan view depicting another aspect of the lead frame of FIG. 8.

FIG. 12 is a sectional view depicting the manufacturing method of the lead frame in accordance with the exemplary embodiment (2 thereof).

FIGS. 19A and 19B are a plan view and a sectional view depicting the manufacturing method of the lead frame in accordance with the first modified embodiment of the exemplary embodiment (2 thereof).

FIG. 21 is a sectional view depicting a manufacturing method of a lead frame in accordance with a second modified embodiment of the exemplary embodiment (1 thereof).

DETAILED DESCRIPTION

Hereinafter, an exemplary embodiment will be described with reference to the accompanying drawings.

Before describing the exemplary embodiment, preliminary matters, which are bases of the present disclosure, are first described.

Figure 1:
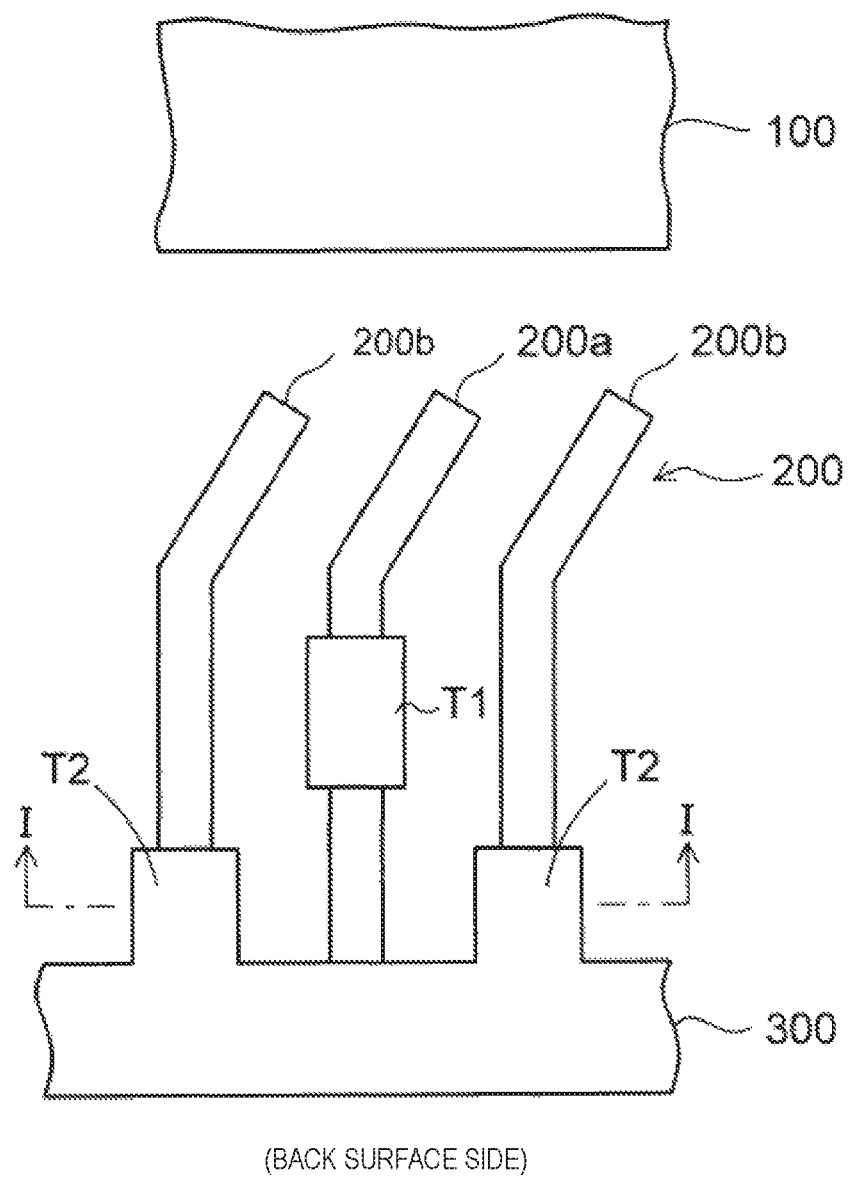
FIG. 1 is a plan view for illustrating a lead frame of preliminary matters (1 thereof).

FIG. 1 illustrates a lead frame of the preliminary matters. It should be noted that the preliminary matters relate to personal investigation contents of the inventors and include a novel technology, not a known technology.

In FIG. 1, a back surface side of a lead frame of the preliminary matters is shown, and a part of a die pad 100 and a part of a lead 200 arranged around the die pad are partially shown.

As shown in FIG. 1, the lead frame of the preliminary matters includes a quadrangular die pad 100, and a lead 200 arranged around the die pad. The lead 200 is coupled to a frame part 300, and includes a first lead 200a and second leads 200b. A first external connection terminal T1 is arranged at a central portion of the first lead 200a in an extension direction. Also, second external connection terminals T2 are arranged at root parts of the second leads 200b located on the frame part 300.

The first external connection terminal T1 and the second external connection terminals T2 protrude from each back surface of the first lead 200a and the second leads 200b. Thereby, outline patterns of the first external connection terminal T1 and the second external connection terminals T2 are demarcated. That is, each of the outline patterns of the first external connection terminal T1 and the second external connection terminals T2 is demarcated by a part of the lead 200 (first lead 200a or second lead 200b) and a portion protruding from the back surface of the part of the lead 200. More specifically, the first external connection terminal T1 is formed by the central portion of the first lead 200a and a portion protruding from the back surface of the central portion of the first lead 200a. The second external connection terminal is formed by the root part of the second lead 200b and a portion protruding from the back surface of the root part of the second lead 200b.

Figure 2A:
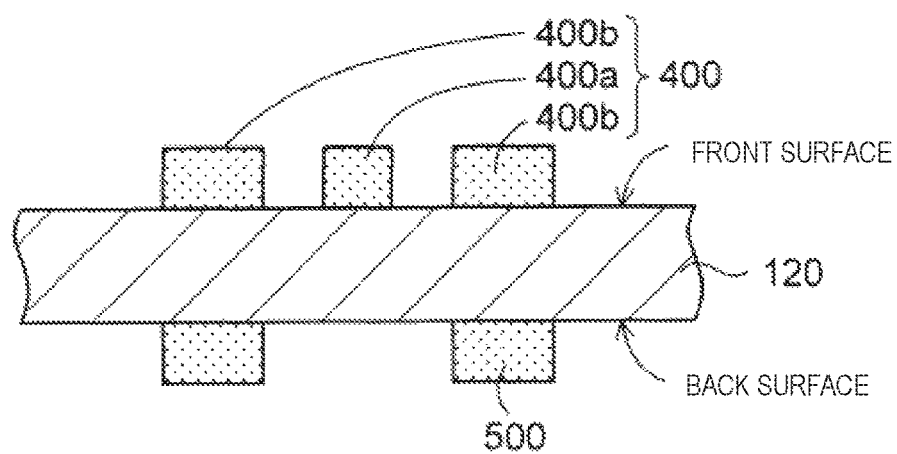
FIGS. 2A and 2B are sectional views for illustrating the lead frame of the preliminary matters (2 thereof).
Figure 2B:
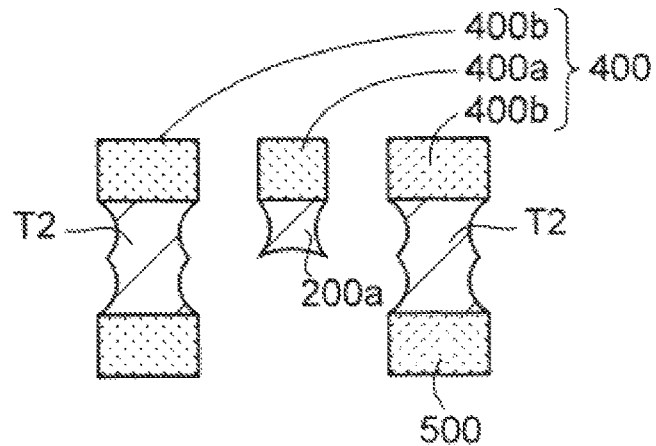

FIGS. 2A and 2B are sectional views taken along a line I-I of FIG. 1, depicting a manufacturing method of the lead frame of FIG. 1. Also, in FIGS. 2A and 2B, a front surface of a metal plate 120 faces upward.

As shown in FIG. 2A, a first resist layer 400 is first patterned on the front surface of the metal plate 120. The first resist layer 400 has a first pattern 400a for obtaining the first lead 200a and the first external connection terminal T1 of FIG. 1, and a second pattern 400b for obtaining the second leads 200b and the second external connection terminals T2 of FIG. 1.

Also, a second resist layer 500 is patterned on a back surface of the metal plate 120. The second resist layer 500 is arranged to correspond to the second pattern 400b of the first resist layer 400. At the back surface side of the metal plate 120, the second resist layer 500 is opened without being arranged in a region corresponding to the first pattern 400a of the first resist layer 400.

As shown in FIG. 2B, the metal plate 120 is wet etched from the front surface side and the back surface side, through opening regions of the first resist layer 400 and the second resist layer 500.

Thereby, the metal plate 100 is isotropically half-etched from the back surface side in a region around the first pattern 400a of the first resist layer 400, so that the first lead 200a of FIG. 1 is obtained. For this reason, a back surface of the first lead 200a becomes a concave surface.

Also, at the same time, the metal plate 120 is wet etched from the front surface side and the back surface side and is thus penetrated in a region around the second pattern 400b of the first resist layer 400, so that the second external connection terminals T2 of FIG. 1 are obtained.

Figure 3A:
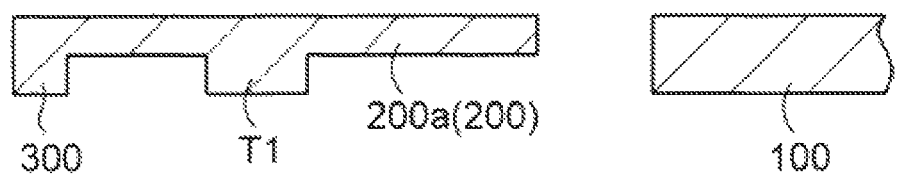
FIGS. 3A and 3B are sectional views for illustrating the lead frame of the preliminary matters (3 thereof).

FIG. 3A is a sectional view depicting a shape where the lead frame of FIG. 1 is turned over and the front surface faces upward. FIG. 3A is a sectional view of the lead frame along a vertical direction of the first lead 200a of FIG. 1. As shown in FIG. 3A, the first external connection terminal T1 protrudes downward from the back surface of the first lead 200a.

Figure 3B:
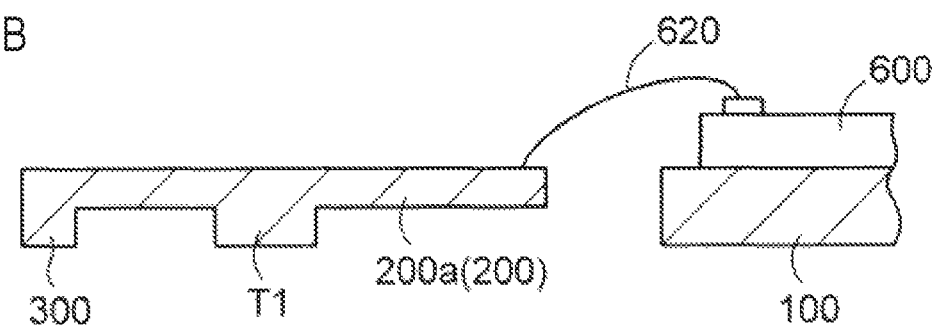

As shown in FIG. 3B, a semiconductor chip 600 is mounted on the die pad 100, and the semiconductor chip 600 and a wire bonding portion of a leading end portion of the lead 200 (the first and second leads 200a, 200b) are connected by a wire 620.

Also, the semiconductor chip 600, the wire 620 and the lead 200 are sealed with a sealing resin (not shown) so that lower surfaces of the first and second external connection terminals T1, T2 of FIG. 1 are exposed.

In recent years, it is required to increase a length of the lead 200 and to bring the wire bonding portion of the leading end of the lead 200 and the die pad 100 closer to each other so as to save the cost of the wire 620 made of gold and to prevent an electric short between the wires 620.

However, as described above, since the lead 200 is formed by half etching the metal plate 120, a thickness thereof is small. Further, as shown in FIG. 2B, since the lower surface of the lead 200 is formed to have the concave shape, a cross-sectional area of the lead 200 is considerably reduced.

Figure 4A:
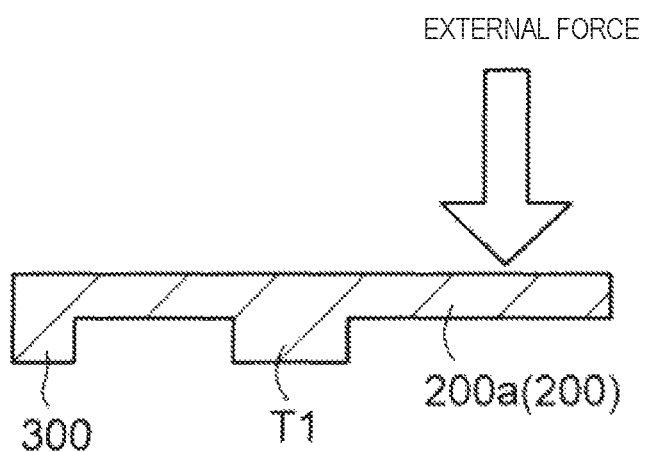
FIGS. 4A and 4B are sectional views for illustrating the lead frame of the preliminary matters (4 thereof).
Figure 4B:
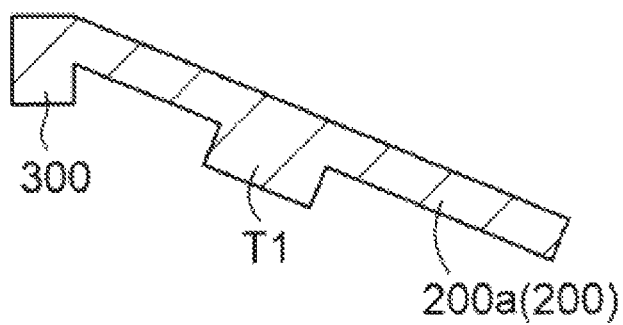

For this reason, as shown in FIGS. 4A and 4B, when an external force is applied to the first lead 200a of which the thickness is small and the length is increased, the root part of the first lead located on the frame part 300 is likely to be deformed. Also, likewise, when the external force is applied to the second lead 200b of FIG. 1, the root part of the second lead located on the second external connection terminal T2 is likely to be deformed.

Therefore, it is difficult to reliably connect e lead 200 of the lead frame and the semiconductor chip 600 by the wire 620.

The deformation of the lead 200 of the lead frame occurs when the lead 200 is caught at an external component or a protection film while the lead frame is conveyed or the lead frame is stacked and stored with the protection film being interposed in a stocker, for example.

As measures against the deformation, a method of decreasing a half etching depth from the back surface of the metal plate 120 to secure the relatively large cross-sectional area of the lead 200 in the manufacturing process of FIG. 2B is considered.

However, according to the method, the etching may be insufficient in the region in which the metal plate 120 is to be etched and to be penetrated from the front surface and the back surface, and an electric short is likely to occur between the leads 200.

Also, when the cross-sectional area of the lead 200 is excessively large, a burr is likely to be generated when cutting the lead 200 from the frame part 300.

The above problems can be solved in a lead frame in accordance with an exemplary embodiment to be described later.

Exemplary Embodiment

FIGS. 5 to 10 illustrate a lead frame of an exemplary embodiment, and FIGS. 11A to 22B illustrate a manufacturing method of the lead frame of the exemplary embodiment.

FIG. 5 is a plan view depicting an entire shape of a lead frame of the exemplary embodiment, as seen from the front surface side. As shown in FIG. 5, a lead frame 1 of the exemplary embodiment has an outer frame part 10 formed by etching a metal plate and having a rectangular outer shape. In the outer frame part 10, three block regions B are demarcated. Inner frame parts 12 coupled to the outer frame part 10 are formed between the respective block regions B.

Also, in each block region B, a plurality of product regions 1Z is respectively demarcated. FIG. 6 is a partially enlarged plan view of one product region R in the block region B of the lead frame 1 of FIG. 5.

As shown in FIG. 6, each quadrangular region demarcated by a frame part 20 is formed as one product region R. The frame part 20 is coupled to the outer frame part 10 and the inner frame part 12 of the lead frame 1 of FIG. 5.

In the meantime, the positions and numbers of the block regions B and the product regions R of the lead frame 1 of FIG. 5 can be arbitrarily set. For example, the lead frame 1 of FIG. 5 may be vertically coupled in plural.

A quadrangular die pad 22 is arranged at a central part of each product region R. Also, support bars 24 are respectively coupled to four corners of the die pad 22 and to the frame part 20.

In this way, the die pad 22 is supported to the frame part 20 by the four support bars 24.

Also, the frame part 20 facing each of four sides of the die pad 22 of each product region R is coupled with five leads 30. In each product region R, the lead 30 extends from an inner wall of the frame part 20 toward the die pad 22 positioned at an inner side.

The leads 30 have first leads 30a and second leads Sob. A central portion of the first lead 30a in an extension direction is formed with a first external connection terminal and the first lead 30a is coupled to the inner wall of the frame part 20. The first external connection terminal T1 is arranged at a position spaced inward from the frame part 20.

Also, a root part of the second lead 30b located on the frame part 20 is formed with a second external connection terminal T2. One end of the second external connection terminal T2 is coupled to the inner wall of the frame part 20, and the other end is coupled to the second lead 30b.

Each width of the first external connection terminal T1 and the second external connection terminal T2 is set to be larger than each width of the first lead 30a and the second lead 30b.

Also, each surface of the first external connection terminal T1 and the second external connection terminal T2 is flush with each surface of the first lead 30a and the second lead 30b.

Also, each leading end portion of the first lead 30a and the second lead 30b is formed as a wire bonding portion WB. As described later, each wire bonding portion WB of the leads 30 and a semiconductor chip are connected by a wire.

Figure 7:
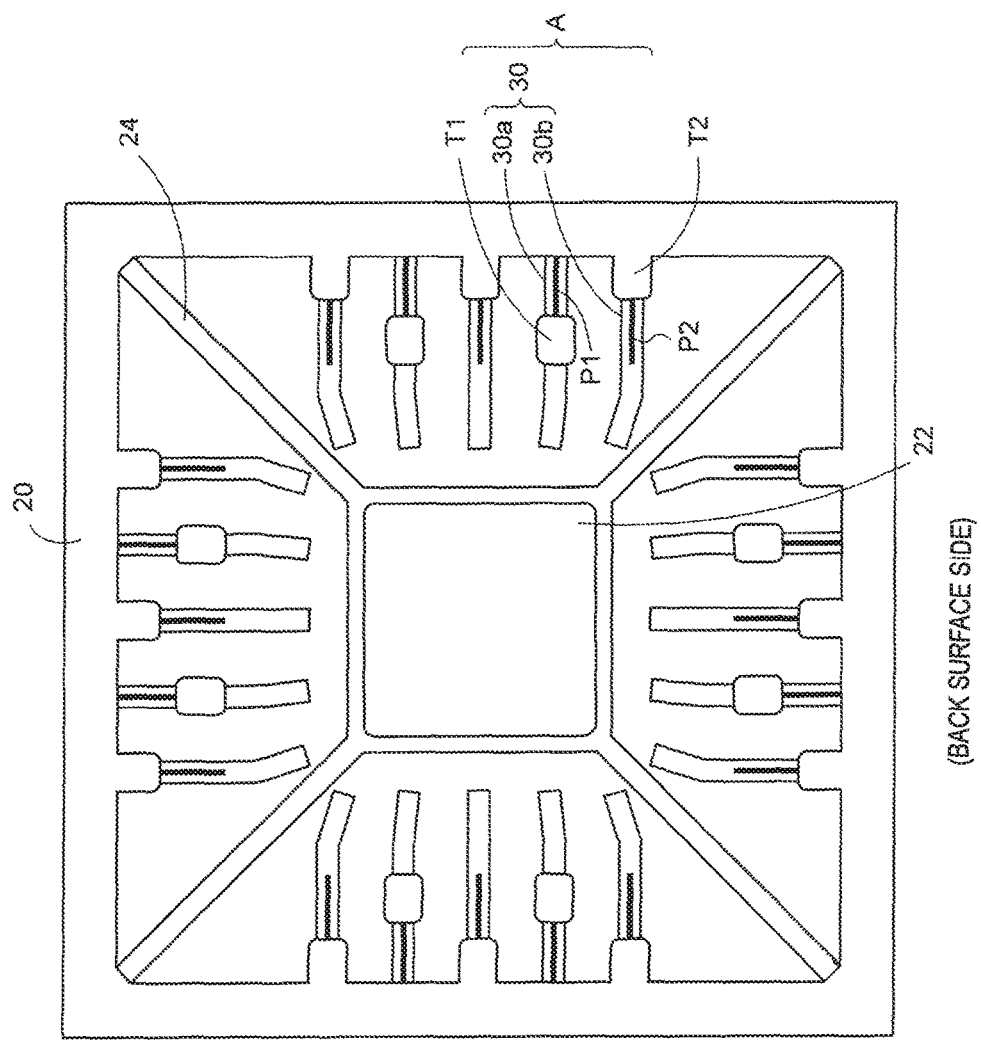
FIG. 7 is a partial plan view depicting the lead frame of one product region of FIG. 5, as seen from a back surface side.

FIG. 7 is a plan view depicting the lead frame 1 turned over from FIG. 6, as seen from a back surface side.

As shown in FIG. 7, when the lead frame 1 of FIG. 6 is seen from the back surface side, the first external connection terminal T1 protrudes from a back surface of the first lead 30a, and a thickness of the first external connection terminal T1 is set to be larger than a thickness of the first lead 30a. Also, likewise, the second external connection terminal T2 protrudes from a back surface of the second lead 30b, and a thickness of the second external connection terminal T2 is set to be larger than a thickness of the second lead 30b.

The first external connection terminal T1 protrudes from the back surface of the first lead 30a, so that an outline pattern of the first external connection terminal T1 demarcated. That is, the outline pattern of the first external connection terminal T1 is demarcated by a part of the first lead 30a and a portion protruding from the back surface of the part of the first lead 30a. More specifically, the first external connection terminal T1 is formed by the central portion of the first lead 30a and a portion protruding from the back surface of the central portion of the first lead 30a.

Also, the second external connection terminal T2 protrudes from the back surface of the second lead 30b, so that an outline pattern of the second external connection terminal T2 is demarcated. That is, the outline pattern of the second external connection terminal T2 is demarcated by a part of the second lead 30b and a portion protruding from the back surface of the part of the second lead 30b. More specifically, the second external connection terminal is formed by the root part of the second lead 30b and a portion protruding from the back surface of the root part of the second lead 30b.

For example, the frame part 20, the first external connection terminal T1, the second external connection terminal T2, and the die pad 22 are formed to have the same thickness. Also, as described later, since the support bar 24 is formed by half etching back surface side thereof, it is formed to have a thickness smaller than the frame part 20 and the like.

Figure 8:
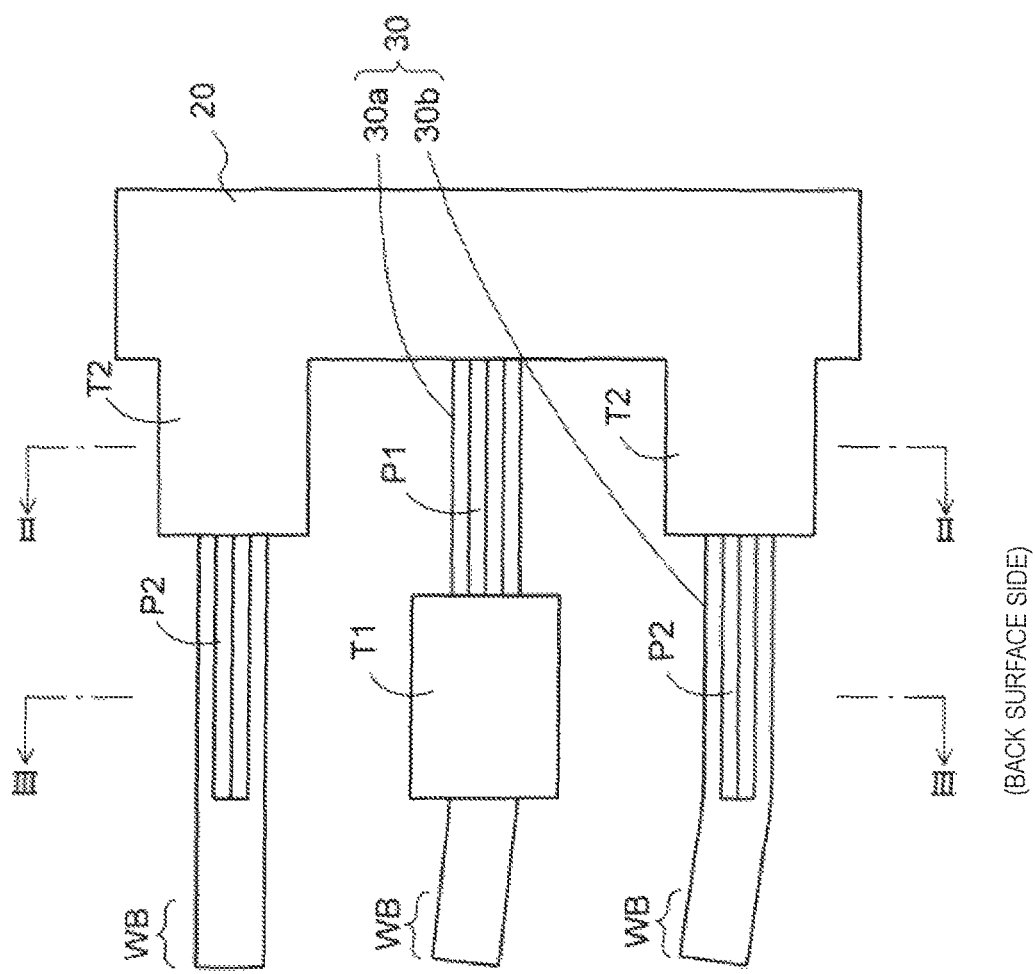
FIG. 8 is a partially enlarged plan view of a region A of the lead frame of FIG. 7.

FIG. 8 is a partially enlarged plan view of a region A of FIG. 7. FIG. 9A is a sectional view taken along a line II-II of FIG. 8, and FIG. 9B is a sectional view taken along a line III-III of FIG. 8.

As shown in FIG. 8, the first external connection terminal T1 is arranged at a middle (for example, a central part) of the first lead 30a in the extension direction. A protrusion P1 extending in the extension direction is formed at a central portion of the back surface of the first lead 30a in a width direction.

The first lead 30a has the protrusion P1 in a region between the frame part 20 and the first external connection terminal T1. The protrusion P1 of the first lead 30a is coupled at one end side to an inner wall of the frame part 20 and is coupled at the other end side to a sidewall of the first external connection terminal T1 In FIG. 7, the protrusion of the first lead 30a is shown with a thick line.

As shown in FIG. 9A, a cross-sectional shape of the first lead 30a of FIG. 8 where the front surface of the first lead 30a faces upward is a pentagonal shape having a quadrangular main body part M and a triangular protrusion P1 protruding from a lower surface of the main body part M. Also, in the cross-sectional shape of the first lead 30a of FIG. 9A, a width W2 of a lower end of the main body part M is set to be smaller than a width W1 of an upper end of the main body part M.

A protrusion height H of the protrusion P1 of the first lead 30a is, for example, 20 μm to 30 μm.

Also, as shown in FIG. 8, the second external connection terminal T2 is arranged at the root part of the second lead 30b located on the frame part 20, and one end side of the second external connection terminal T2 is coupled to the inner wall of the frame part 20.

Also, as shown in FIG. 9B, the second lead 30b has also the same cross-sectional shape as the first lead 30a, and is formed with a protrusion P2 that is the same as the first lead 30a. The protrusion P2 of the second lead 30b is formed in an inner region from the other end side of the second external connection terminal T2.

The protrusion P2 of the second lead 30b is coupled to a side-wall of the other end of the second external connection terminal T2.

Also, in FIG. 7, the protrusion P2 of the second lead 30b is shown with a thick line, like the protrusion P1 of the first lead 30a.

Also, as shown in FIG. 8, the first lead 30a has a structure where the protrusion P1 is not arranged from an outer end of the first external connection electrode T1 to a region in which the wire bonding portion WB is arranged.

Also, the second lead 30b has a structure where the protrusion P2 is formed from the other end side of the second external connection terminal T2 to a region corresponding to the outer end (an end portion facing toward the wire bonding portion WB) of the first external connection terminal T1 and is not arranged in a region, which is closer to a leading end side than the region and the wire bonding portion WB is arranged therein.

In this way, since the wire bonding portions WB are arranged at the leading end portions of the first and second leads 30a, 30b in the more inner regions than the first external connection terminal T1, the protrusions P1, P2 are not formed on the back surfaces of the wire bonding portions WB.

That is, if the protrusions P1, P2 having a triangular section are arranged on the back surfaces of the wire bonding portions WB, the wire bonding portions WB may be tilted upon the wire bonding, so that a problem may be caused upon the wire bonding.

As described later in a manufacturing method, the lead 30 of the lead frame 1 is formed by half etching a metal plate from a back surface thereof, and the first and second external connection terminals T1, T2 are formed by penetrating the metal plate from the front surface and back surface by wet etching. For this reason, a thickness of the lead 30 is smaller than thicknesses of the first and second external connection terminals T1, T2.

In the exemplary embodiment, the back surface of the first lead 30a is formed thereon with the protrusion P1, and the protrusion P1 is coupled to the inner wall of the frame part 20 of a thick film. Also, the back surface of the second lead 30b is formed thereon with the protrusion P2, and the protrusion P2 is coupled to the outer end of the second external connection terminal T2 of a thick film.

For this reason, as described above in the preliminary matters, even when the lead 30 is lengthened so as to reduce the wire and to prevent the electric short between the wires, it is possible to increase the strength of the lead 30.

Thereby, even though the external force is applied to the lead 30, it is possible to prevent the deformation of the root part between the frame part 20 and the second external connection terminal T2. Therefore, it is possible to reliably connect the wire bonding portion WB of the lead 30 of the lead frame 1 and the semiconductor chip by the wire.

Also, in the exemplary embodiment, the cross-sectional shape of the lead 30 where the front surface of the lead 30 faces upward is the pentagonal shape having the quadrangular main body part M and the triangular protrusion P1 protruding from the lower surface of the main body part M. Also, the width W2 of the lower end of the main body part M is set to be smaller than the width W1 of the upper end.

Thereby, it is possible to reduce the cross-sectional area, as compared to a structure where the width W2 of the lower end of the main body part M is larger than the width W1 of the upper end.

For this reason, when cutting the lead 30 and separating the same from the frame part 20, a burr is prevented from being generated from the lead 30.

Also, in the exemplary embodiment, as described later in the manufacturing method, it is possible to increase heights of the protrusions P1, P2 by lowering an etching rate from the back surface of the metal plate. For example, the thicknesses of the first and second leads 30a, 30b are set to be 50% to 70% of the thicknesses (a thickness of the metal plate) of the first and second external connection terminals T1, T2.

For this reason, while preventing the burr by reducing the cross-sectional area of the lead 30, it is possible to sufficiently reinforce the strength by increasing the heights of the protrusions P1, P2 of the leads 30.

Also, as shown in FIGS. 9A and 9B, the first external connection terminal T1 and the second external connection terminal T2 are formed so that a width of the back surface side is larger than a width of the front surface side so as to increase areas, which are exposed from a sealing resin 50, of the back surfaces of the first external connection terminal T1 and the second external connection terminal T2 in an electronic component device 2 in FIG. 28 (which will be described later) and thus improve the bonding strength by the soldering between the external connection terminals of the electronic component device 2 and pads of a mounting board.

In order to obtain the above-described shape, in etching processes of FIGS. 14 and 15 (which will be described later), a width of a second resist layer 13b is set to be larger than a width of a first resist layer 13a in parts of a metal plate 5 in which the first external connection terminal T1 and the second external connection terminal T2 are to be formed.

Figure 17:
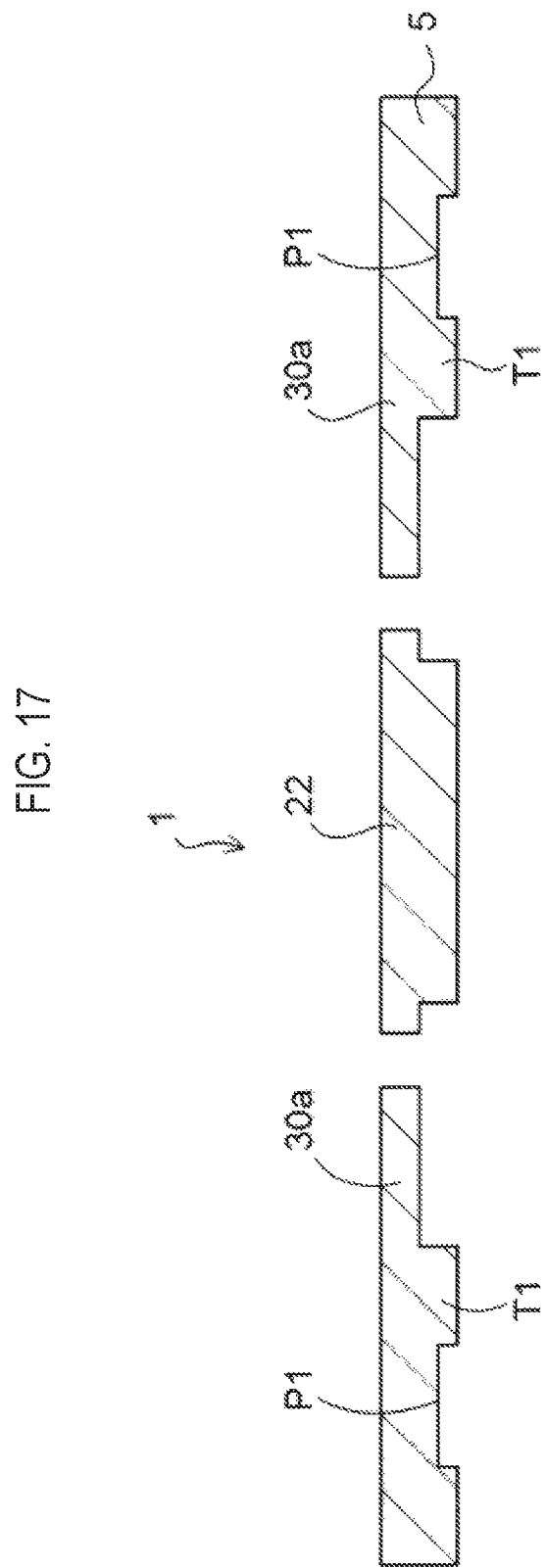
FIG. 17 is a sectional view depicting the manufacturing method of the lead frame in accordance with the exemplary embodiment (7 thereof).
Figure 26:
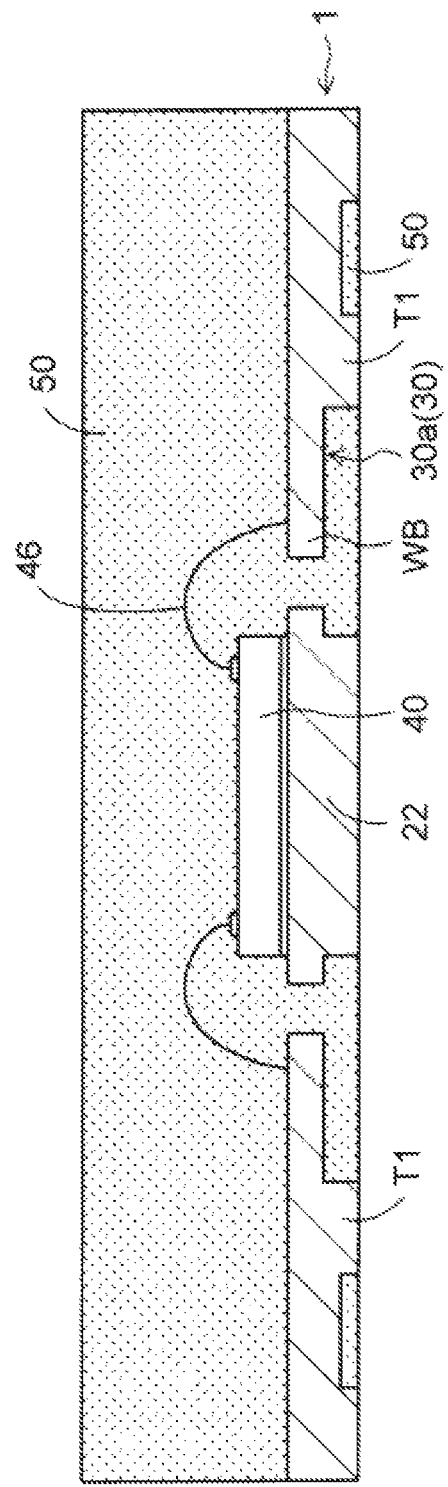
FIG. 26 is a sectional view depicting the manufacturing method of the electronic component device in which the lead frame of the exemplary embodiment is used (3 thereof).

Also, a die pad 22 is formed so that a width of a back surface side is smaller than a width of a front surface side so as to prevent separation from the sealing resin 50 in FIG. 26 (refer to FIG. 17). An entire outer periphery of the back surface side of the die pad 22 is provided with a step portion of which a thickness is smaller than a central part of the die pad 22.

In order to form the step portion, in the etching processes of FIGS. 14 and 15 (which will be described later), a width of the second resist layer 13b is set to be smaller than a width of the first resist layer 13a in a part (not shown) of the metal plate 5 in which the die pad 22 is to be formed.

FIG. 10 depicts an aspect where the first lead 30a and the second lead 30b are further lengthened. As shown in FIG. 10, when the first lead 30a is further lengthened, the protrusion P1 may be formed from the outer end of the first external connection terminal T1 toward the leading end of the first lead 30a. This protrusion P1 is formed up to a region before the wire bonding portion WB.

Also, when the second lead 30b is further lengthened, the protrusion P2 may be extended toward the leading end of the second lead 30b. This protrusion P2 is formed up to a region before the wire bonding portion WB beyond the outer end of the first external connection terminal T1.

Subsequently, a manufacturing method of the lead frame 1 shown in FIGS. 5 to 10 is described with reference to FIGS. 11A to 23B.

Figure 11A:
FIGS. 11A and 11B are sectional views depicting a manufacturing method of a lead frame in accordance with an exemplary embodiment (1 thereof).

As shown in FIG. 11A, a metal plate 5 is first prepared. The metal plate 5 is formed of copper, copper alloy, iron/nickel alloy or the like, and a thickness thereof is 0.1 mm to 0.25 mm.

FIG. 11A partially depicts the metal plate 5 corresponding to one product region R in the block region B of the lead frame 1 shown in FIG. 5.

Figure 11B:
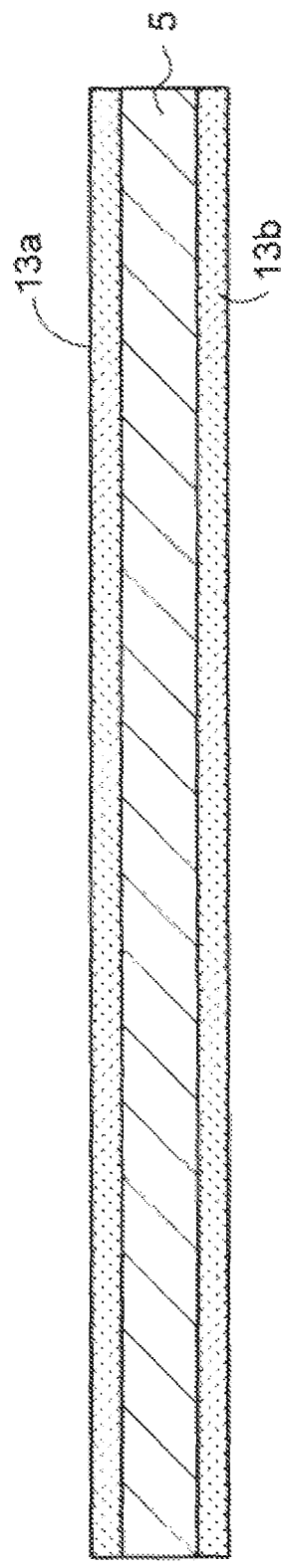

Then, as shown in FIG. 11B, a first resist layer 13a is formed on a front surface of the metal plate 5, and a second resist layer 13b is formed on a back surface. The first resist layer 13a and the second resist layer 13b may be formed by bonding dry film resists or applying liquid resist.

Then, as shown in FIG. 12, the first resist layer 13a of the front surface side of the metal plate 5 is exposed and developed on the basis of a photolithography, so that the first resist layer 13a is patterned.

Also, likewise, the second resist layer 13b of the back surface side of the metal plate 5 is exposed and developed on the basis of the photolithography, so that the second resist layer 13b is patterned.

In a sectional view of FIG. 12, the patterns of the first and second resist layers 13b in a region corresponding to a cross-section taken along a line X1-X1 including the first lead 30a of the lead frame 1 shown in FIG. 6 are shown.

Figure 13:
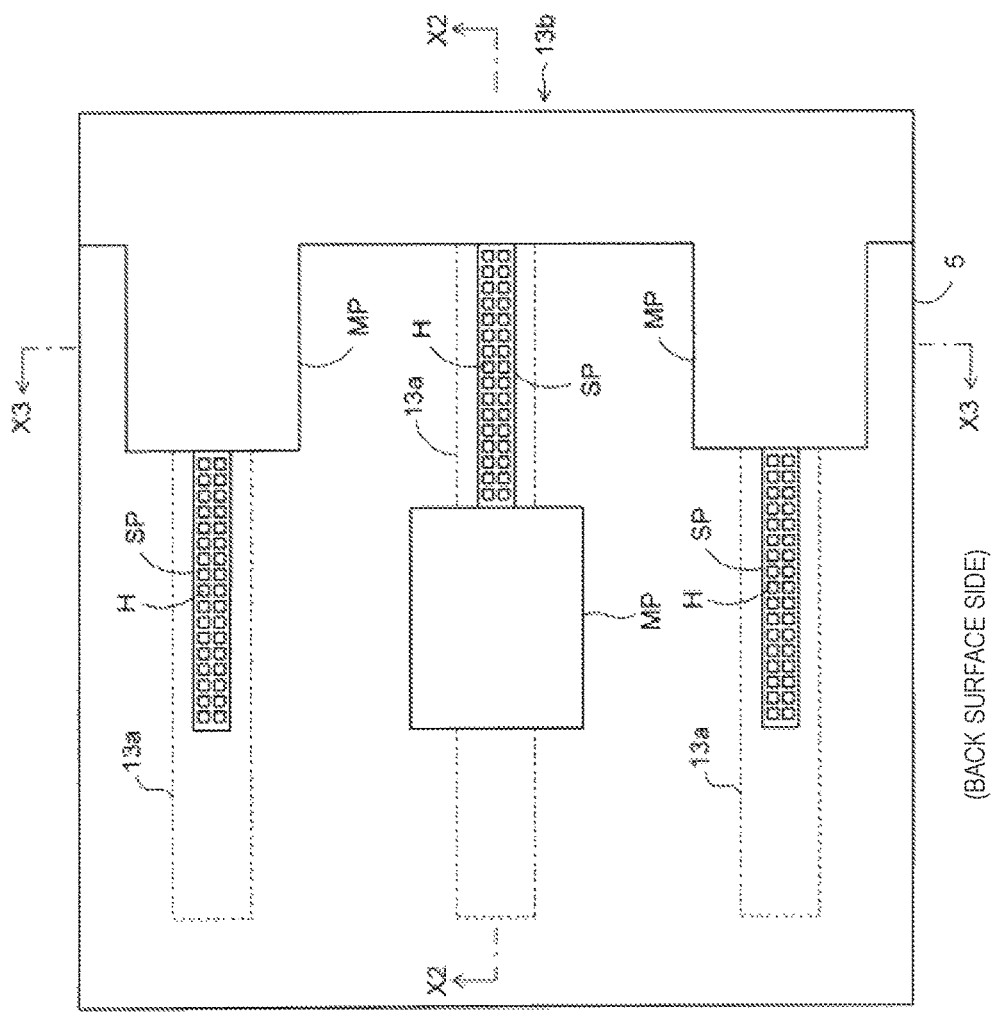
FIG. 13 is a sectional view depicting the manufacturing method of the lead frame in accordance with the exemplary embodiment (3 thereof).

Also, FIG. 13 is a partial plan view depicting the second resist layer 13b and a surrounding shape thereof in a region B of the back surface side shown in the sectional view of FIG. 12. A cross-section taken along a line X2-X2 of FIG. 13 corresponds to the region B of the sectional view of FIG. 12.

The first resist layer 13a of the front surface side of the metal plate 5 of FIG. 12 is formed to have a pattern corresponding to each pattern of the lead frame 1 shown in FIG. 5. Specifically, the first resist layer 13a is patterned on the front surface of the metal plate 5 so that it corresponds to each pattern of the outer frame part 10, the inner frame part 12, the frame part 20, the leads 30, the first and second external connection terminals T1, T2, the die pad 22, and the support bars 24.

Also, the second resist layer 13b of the back surface side of the metal plate 5 shown in FIG. 12 is basically formed to have a pattern corresponding to the pattern of the first resist layer 13a, except for a pattern for forming the leads 30.

Meanwhile, as shown in FIG. 13, in regions in which the leads 30 are to be formed, auxiliary patterns SP of the second resist layer 13b are arranged at portions at which the protrusions P1, P2 are to be arranged. Also, in the regions in which the leads 30 are to be formed, regions of the leads 30 in which the protrusions P1, P2 are not to be formed are not arranged therein with the auxiliary patterns SP and are opened.

Figure 14:
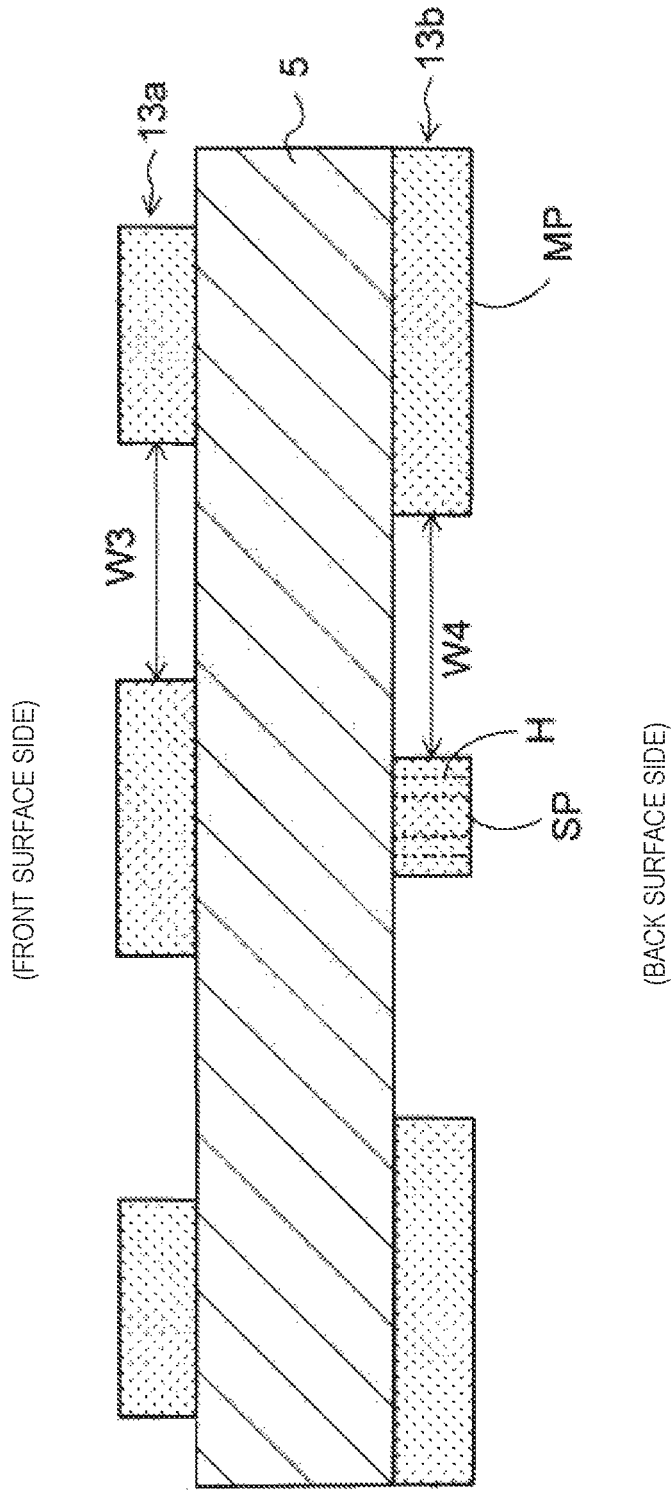
FIG. 14 is a sectional view depicting the manufacturing method of the lead frame in accordance with the exemplary embodiment (4 thereof).

FIG. 14 is a partially sectional view taken along a line X3-X3 of FIG. 13, In FIG. 14, the front surface of the metal plate 5 faces upward.

In this way, the second resist layer 13b having main patterns MP corresponding to a pattern except for the leads 30 and the auxiliary patterns SP corresponding to the protrusions P1, P2 of the leads 30 is patterned on the back surface of the metal plate 5. The patterns of the lead frame 1 except for the leads 30 are the outer frame part 10, the inner frame part 12, the frame part 20, the first and second external connection terminals T1, T2, and the die pad 22. The support bar 24 is formed by half etching the back surface side thereof, so that a pattern corresponding to the support bar 24 is not formed at the second resist layer 13b.

Referring to FIGS. 13 and 14, a width of the auxiliary pattern SP of the second resist layer 13b is set to be smaller than a width (a pattern of a broken line in FIG. 13) of a pattern of the first resist layer 13a of the front surface side for forming the lead 30.

Also, in the auxiliary pattern SP of the second resist layer 13b, a plurality of hole portions H is arranged in a lattice shape. The plurality of hole portions H is arranged in the auxiliary pattern SP of the second resist layer 13b, so that the metal plate 5 is etched from even parts in which the auxiliary patterns SP are arranged. The hole portion H has a square shape of 30 μm×30 μm, a circular shape having a diameter of 30 μm, or the like, for example.

By adjusting an opening ratio of the auxiliary pattern SP of the second resist layer 13b, it is possible to adjust an etching rate of the metal plate 5 from the part at which the auxiliary pattern SP is arranged.

Thereby, it is possible to control heights and shapes of the protrusions P1, P2 to be formed at the leads 30.

As described above in the preliminary matters, in FIG. 14, if the auxiliary pattern SP is not arranged in the second resist layer 13b of the back surface side of the metal plate 5, the back surface of the lead 30 has a concave shape.

Also, as shown in FIG. 14, an opening width W4 between the auxiliary pattern SP and the adjacent main pattern MP of the second resist layer 13b of the back surface side of the metal plate 5 is set to be larger than an opening width W3 between the patterns of the first resist layer 13a of the front surface side. The main pattern MP of the second resist layer 13b is to form a pattern of the lead frame 1 except for the lead 30.

Then, the metal plate 5 is wet etched from the front surface side and the back surface side through the respective opening regions of the first resist layer 13a and the second resist layer 13b of the metal plate 5 of FIG. 14.

Figure 15:
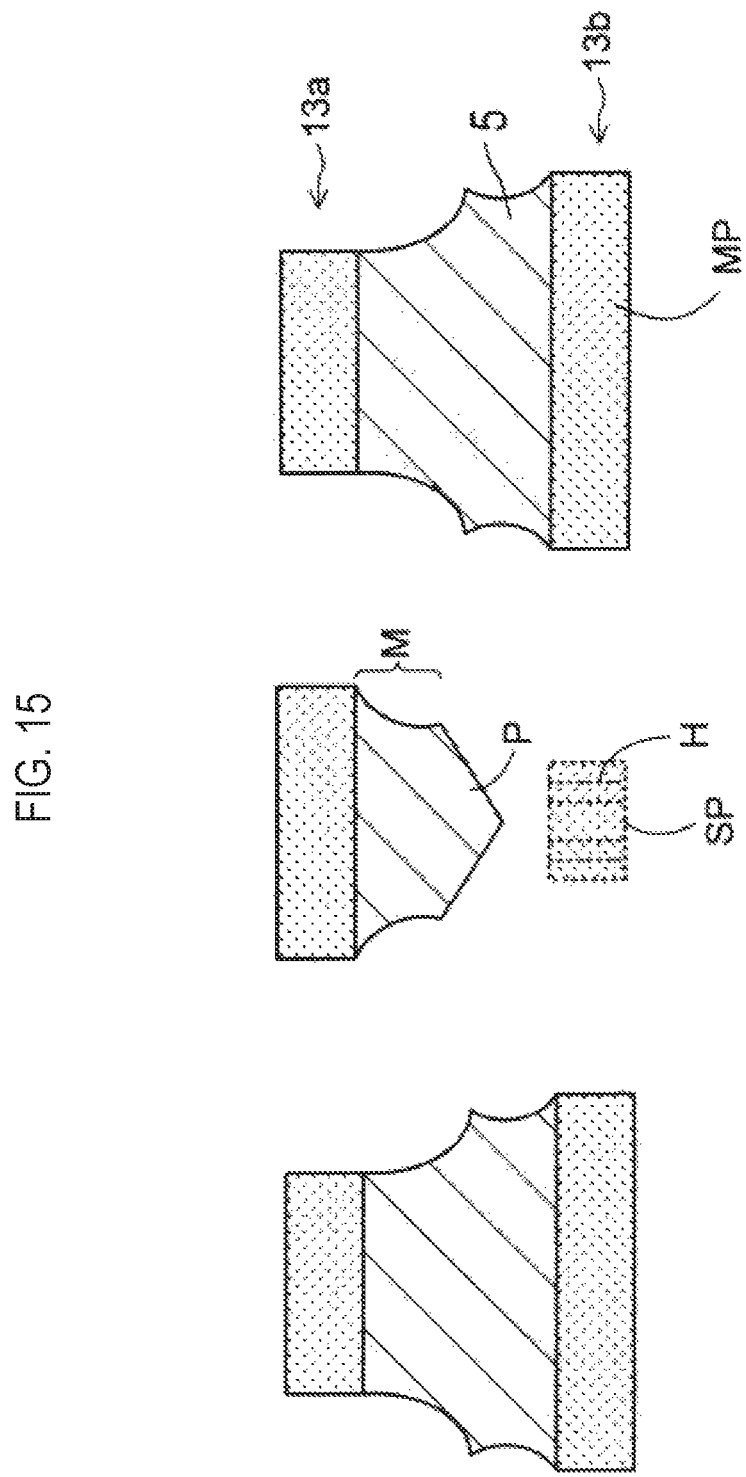
FIG. 15 is a sectional view depicting the manufacturing method of the lead frame in accordance with the exemplary embodiment (5 thereof).

At this time, as shown in FIG. 15, etched surfaces from the opening regions of the first resist layer 13a of the front surface side of the metal plate 5 and etched surfaces from the opening regions of the second resist layer 13b of the back surface side are made to communicate with each other, so that the metal plate 5 is penetrated.

Also, the metal plate 5 in the region in which the auxiliary pattern SP of the second resist layer 13b of the back surface side is arranged is also wet etched from the back surface through the hole portions H of the auxiliary pattern SP. At this time, an etching amount of the metal plate 5 through the hole portions H of the auxiliary pattern SP is smaller than an etching amount of the metal plate 5 through the opening region. For this reason, a height of the lead 30 can be set to be 50% to 70% of the thickness of the metal plate 5.

Also, the back surface side of the lead 30 is formed by the etched surface of the lower etching rate through the hole portions H of the auxiliary pattern SP and the etched surface of the higher etching rate through the opening region. Thereby, the back surface of the lead 30 is formed with the protrusion P1, P2 protruding downward.

Also, as described above, the opening width W4 of the second resist layer 13b of the back surface side is set to be larger than the opening width W3 of the first resist layer 13a of the front surface side (FIG. 14).

For this reason, the etching amount of the metal plate 5 from the opening region of the second resist layer 13b of the back surface side is larger than the etching amount from the opening region of the first resist layer 13a of the front surface side.

Thereby, when the quadrangular main body part M of the lead 30 having a pentagonal section is formed, depression of side surfaces of the main body part M is suppressed. As a result, the main body part M is formed so that a position of the lower end of the main body part M is arranged at an inner side. In this way, as described above, the main body part M is formed so that the width W2 of the lower end of the main body part M of the lead 30 having a pentagonal section is smaller than the width W1 of the upper end (FIG. 9A).

Figure 16:
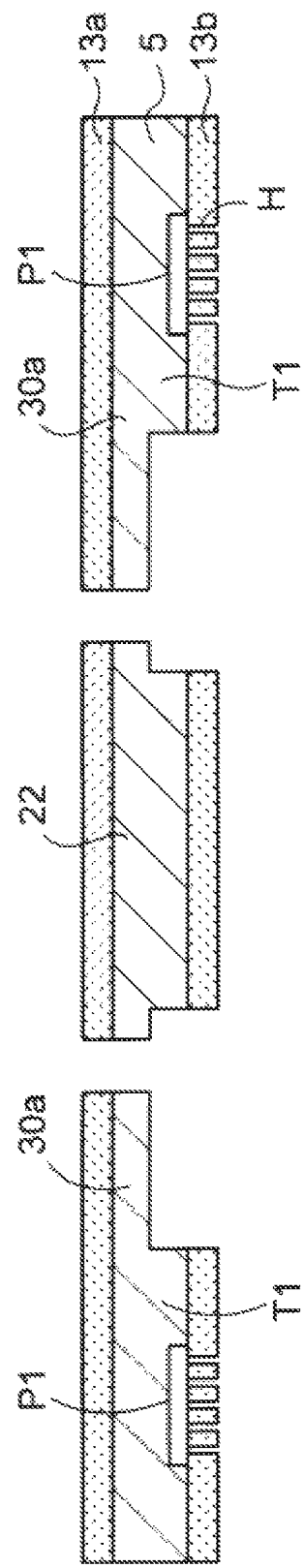
FIG. 16 is a sectional view depicting the manufacturing method of the lead frame in accordance with the exemplary embodiment (6 thereof).

FIG. 16 depicts a shape where the metal plate 5 of FIG. 12 is wet etched from the front surface side and the back surface side and is thus penetrated. In FIG. 16, a shape where the protrusion P1 is formed on the back surface of the first lead 30a in the region in which the auxiliary pattern SP of the second resist layer 13b of the back surface side is arranged is partially shown.

Like this, in the regions in which the leads 30 are to be arranged, the pattern of the first resist layer 13a corresponding to the leads 30 is arranged on the front surface side of the metal plate 5, and the metal plate 5 is half etched from the back surface, so that the leads 30 having the protrusions P1, P2 are formed.

Meanwhile, in the regions in which the patterns such as the first and second external connection terminals T1, T2, the frame part 20 and the like except for the lead 30 and the support bar 24 are arranged, the first resist layer 13a of the front surface side and the second resist layer 13b of the back surface side of the metal plate 5 are formed in the corresponding patterns, and the metal plate 5 is penetrated from both surfaces.

Like this, the metal plate 5 is half etched from the back surface side, so that the leads 30 having the protrusions P1, P2 are obtained, and the metal plate 5 is penetrated from the front surface side and the back surface side, so that the frame part 20, the first and second external connection terminals T1, T2 and the like are obtained.

In this way, the metal plate 5 is etched, so that the outer frame part 10, the inner frame parts 12, the frame parts 20, the first and second external connection terminals T1, T2, the die pads 22, and the support bars 24, the leads 30 of the lead frame 1 shown in FIGS. 5 and 6 are formed at the same time.

Meanwhile, in the etching processes of FIGS. 14 to 16, when it is possible to easily control the etching amounts, the hole portions H may not be formed in the auxiliary patterns SP of the second resist layer 13b.

Then, as shown in FIG. 17, the first resist layer 13a and the second resist layer 13b are removed from the etched metal plate 5 of FIG. 16.

By the above, the lead frame 1 shown in FIGS. 5 and 6 is manufactured.

After the process of FIG. 17, a plated layer may be formed at necessary portions such as the first external connection terminal T1, the second external connection terminal T2, the wire bonding portion WB and the like of the lead frame 1. As the plated layer, a silver plated layer, a staked film of nickel plated layer/palladium plated layer/gold plated layer, or the like is used.

FIGS. 18 to 20B depict a manufacturing method of the lead frame in accordance with a first modified embodiment of the exemplary embodiment. In the example of FIG. 13, the auxiliary patterns SP are coupled to the main patterns MP for obtaining the first and second external connection terminals T1, T2 in the second resist layer 13b formed on the back surface side of the metal plate 5.

In this structure, when forming the lead 30 by half etching the metal plate 5 from the back surface, the metal plate 5 is not sufficiently etched in the thickness direction at the coupling portions of the first and second external connection terminals T1, T2 with the protrusions P1, P2.

As a result, the coupling portions of the first and second external connection terminals T1, T2 with the protrusions P1, P2 are tapered, so that a shape different from a quadrangular outer shape of a design specification is obtained, as seen from above. This may not be favorable depending on a product.

Figure 18:
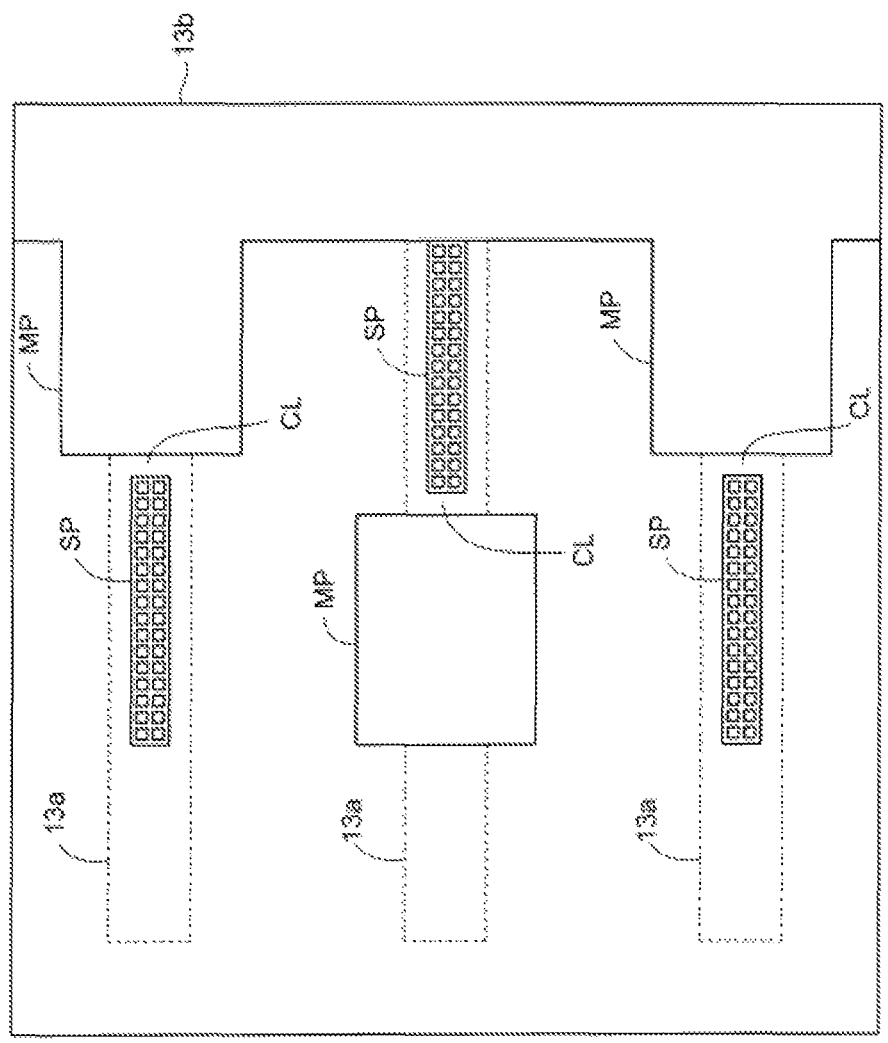
FIG. 18 is a sectional view depicting a manufacturing method of a lead frame in accordance with a first modified embodiment of the exemplary embodiment (1 thereof).

As measures against the above, as shown in FIG. 18, in the process of FIG. 13, the main patterns MP for obtaining the first and second external connection terminals T1, T2 and the auxiliary patterns SP of the second resist layer 13b are arranged with intervals CL being interposed therebetween.

Thereby, as shown in FIGS. 19A and 19B, in the first lead 30a, the first external connection terminal T1 and the protrusion P1 of the first lead 30a are separately formed with the interval CL being interposed therebetween. A sectional view of FIG. 19B corresponds to a cross-section taken along a line X4-X4 of FIG. 19A.

Figures 20A, 20B:
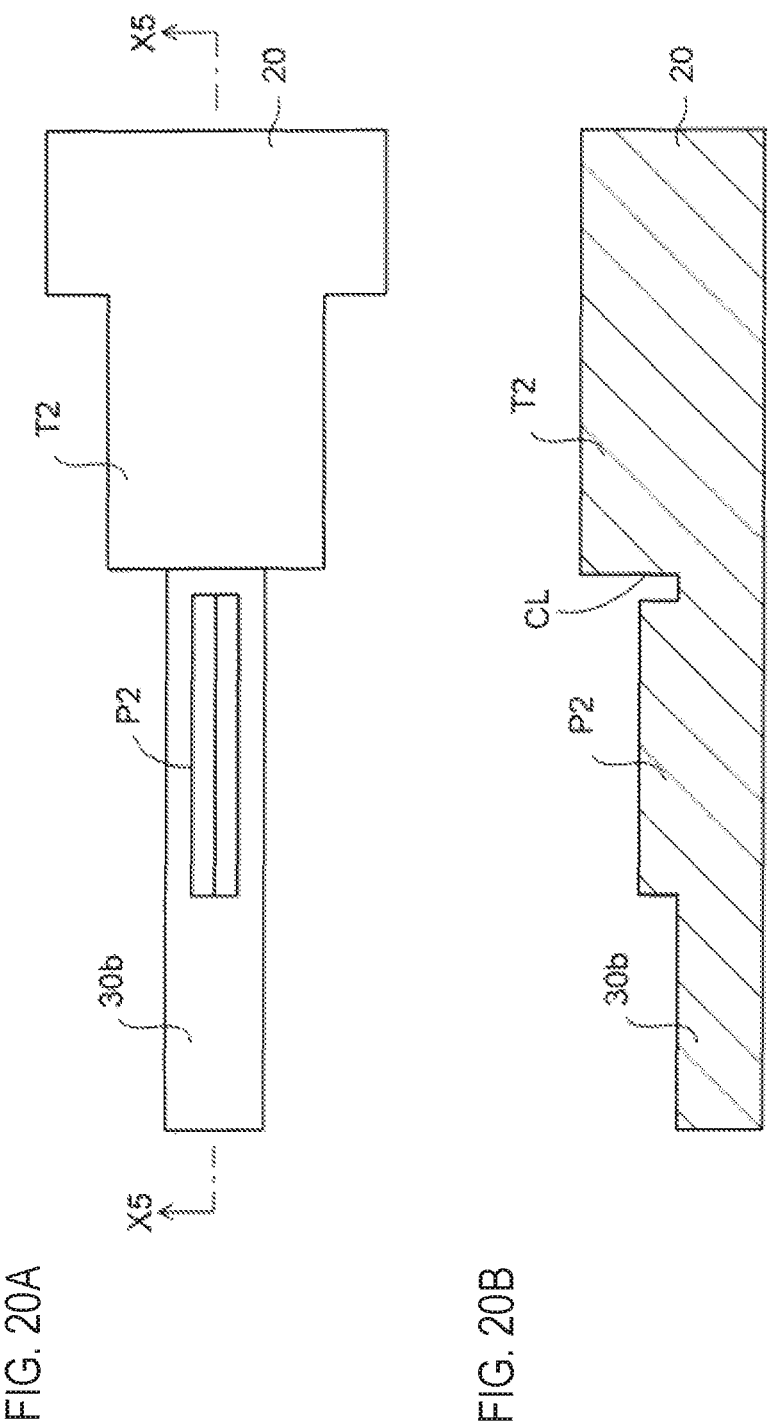
FIGS. 20A and 20B are a plan view and a sectional view depicting the manufacturing method of the lead frame in accordance with the first modified embodiment of the exemplary embodiment (3 thereof).

Also, likewise, as shown in FIGS. 20A and 20B, also in the second lead 30b, the second external connection terminal T2 and the protrusion P2 of the second lead 30b are separately formed with the interval CL being interposed therebetween. A sectional view of FIG. 20B corresponds to a cross-section taken along a line X5-X5 of FIG. 20A.

In this way, since the metal plate 5 in the regions between the first and second external connection terminals T1, T2 and the protrusions P1, P2 is sufficiently etched in the thickness direction, the quadrangular outer shapes of the first and second external connection terminals T1, T2 of a design specification, as seen from above, are obtained.

Also, FIGS. 21 to 23B depict a manufacturing method of the lead frame in accordance with a second modified embodiment of the exemplary embodiment. As shown in FIG. 21, when forming the second resist layer 13b on the back surface side of the metal plate 5, in FIG. 13, coupling patterns CP having a width larger than the auxiliary patterns SP are coupled to the main patterns MP for obtaining the first and second external connection terminals T1, T2.

The etching rate of the metal plate 5 through the coupling pattern CP is set to be higher than the etching rate through the auxiliary pattern SP. Specifically, as shown in FIG. 21, a size of a hole portion Hx of the coupling pattern CP is set to be larger than a size of the hole portion H of the auxiliary pattern SP.

At this time, the size and opening ratio of the hole portion Hx of the coupling pattern CP are adjusted so that the etching rate of the metal plate 5 through the coupling pattern CP is lower than the etching rate through the opening region.

Figure 22A:
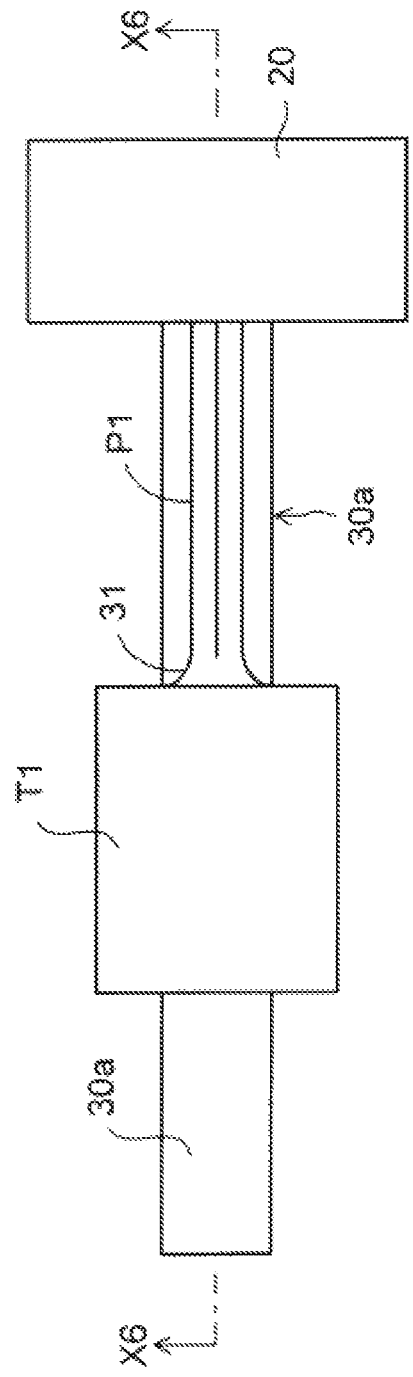
FIGS. 22A and 22B are a plan view and a sectional view depicting the manufacturing method of the lead frame in accordance with the second modified embodiment of the exemplary embodiment (2 thereof).
Figure 22B:
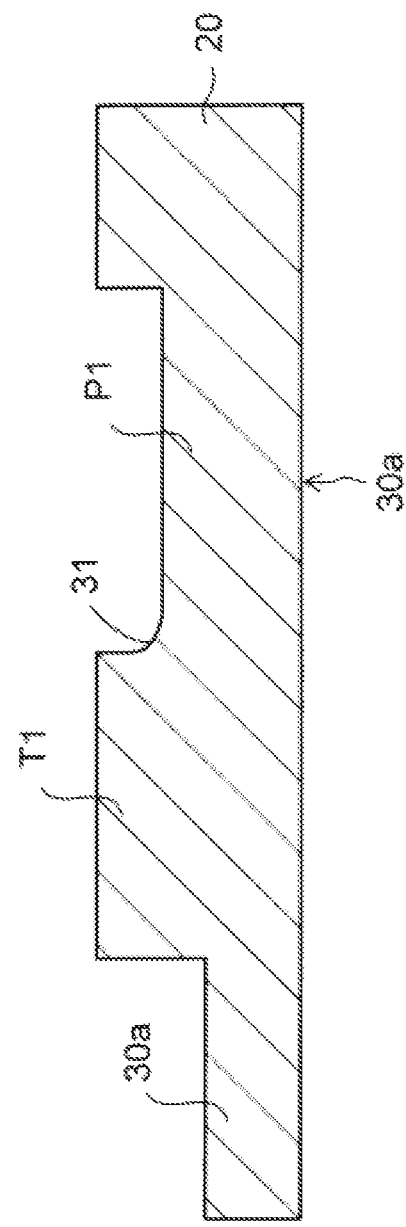

FIGS. 22A and 22B depict the etched metal plate 5 by forming the second resist layer 13b having the above structure. A sectional view of FIG. 22B corresponds to a cross-section taken along a line X6-X6 of FIG. 22A, which is a plan view.

As shown in FIG. 22A, in the first lead 30a, a curved coupling part 31 having a width larger than the protrusion P1 and smaller than the first external connection terminal T1 is formed between the first external connection terminal T1 and the protrusion P1 of the first lead 30a.

Also, as described above, the etching rate of the metal plate 5 through the coupling pattern CP of the second resist layer 13b is lower than the etching rate through the opening region and is higher than the etching rate through the auxiliary pattern SP.

For this reason, as shown in FIG. 22B, a height of the coupling part 31 is set to be higher than the protrusion P1 of the first lead 30a and lower than a height of the first external connection terminal T1. Also, a cross-sectional shape of the coupling part 31 is a skirt shape of which a height decreases from the first external connection terminal T1 toward the protrusion P1 of the first lead 30a, and is a curved shape.

The reason is that even though the coupling pattern CP of the second resist layer 13b is provided with the hole portions Hx having a large size, the etching rate of the metal plate 5 becomes lower in the region of the first external connection terminal T1.

Figure 23A:
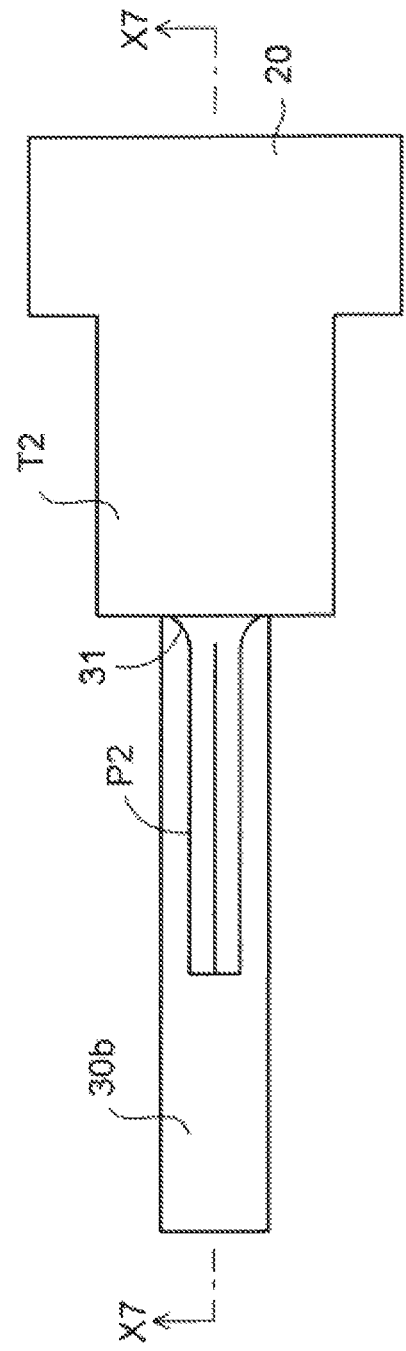
FIGS. 23A and 23B are a plan view and a sectional view depicting the manufacturing method of the lead frame in accordance with the second modified embodiment of the exemplary embodiment thereof).
Figure 23B:
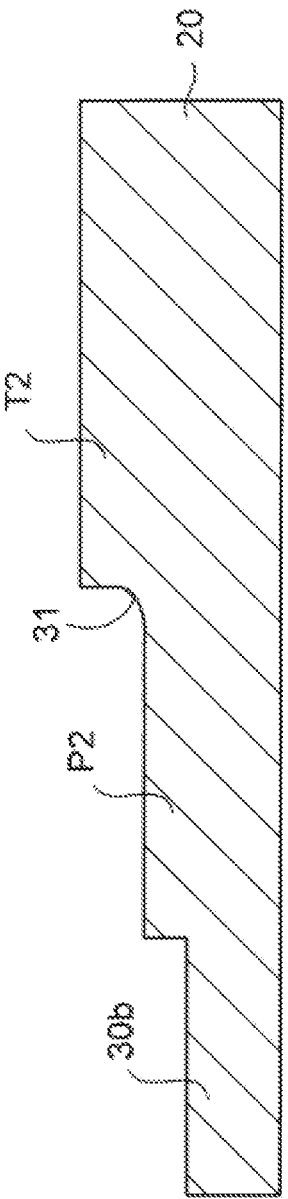

Also, likewise, as shown in FIGS. 23A and 23B, also in the second lead 30b, a coupling part 31 having a width larger than the protrusion P2 and smaller than the second external connection terminal T2 is formed between the second external connection terminal T2 and the protrusion P2 of the second lead 30b. A cross-sectional shape of the coupling part 31 of the second lead 30b is also a skirt shape.

A sectional view of FIG. 23B corresponds to a cross-section taken along a line X7-X7 of FIG. 23A, which is a plan view.

In this way, since the protrusions P1, P2 of the first and second leads 30a, 30b are coupled to the first and second external connection terminals T1, T2 via the coupling parts 31 having a width larger than the protrusions P1, P2, it is possible to further increase the strength of the leads 30.

Also, since the sidewalls of the first and second external connection terminals T1, T2 facing toward the coupling parts 31 are sufficiently etched from the upper surface of the metal plate 5 and are demarcated, the quadrangular outer shapes of the first and second external connection terminals T1, T2 of the design specification are obtained.

As described above, the width of the coupling part 31 is set to be larger than the widths of the protrusions P1, P2, and the height of the coupling part 31 is set to be lower than the heights of the first and second external connection terminals T1, T2. Thereby, it is possible to further reinforce the lead 30, and to obtain the outer shapes of the first and second external connection terminals T1, T2 of the design specification.

Subsequently, a method of manufacturing an electronic component device by using the lead frame of FIG. 17 is described with reference to FIGS. 24 to 29.

Figure 24:
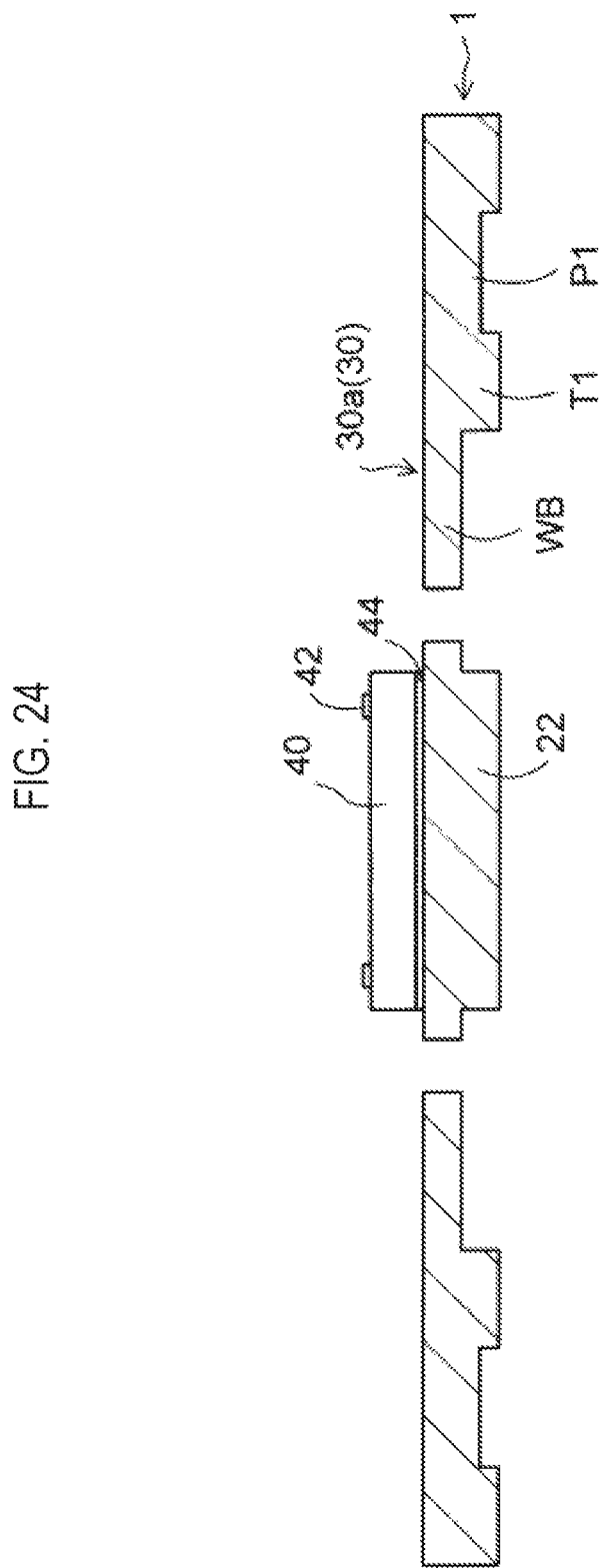
FIG. 24 is a sectional view depicting a manufacturing method of an electronic component device in which the lead frame of the exemplary embodiment is used (1 thereof).

As shown in FIG. 24, a semiconductor chip 40 having connection pads 42 on a front surface is first prepared. A back surface of the semiconductor chip 40 is bonded on the die pad 22 of each product region R of the lead frame 1 by an adhesive 44.

Figure 25:
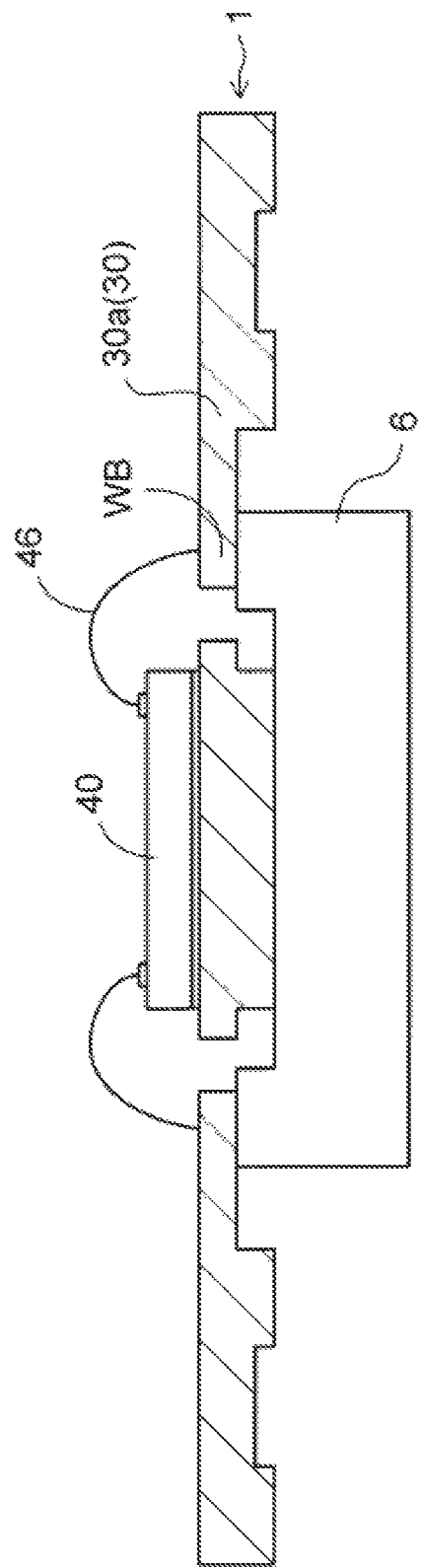
FIG. 25 is a sectional view depicting the manufacturing method of the electronic component device in which the lead frame of the exemplary embodiment is used (2 thereof).

Then, as shown in FIG. 25, the lead frame 1 having the semiconductor chip 40 of FIG. 24 mounted thereon is arranged on a stage 6 of a wire bonding device. Then, the connection pads 42 of the semiconductor chip 40 and the wire bonding portions WB of the leads 30 are connected with metal wires 46 of gold, copper or the like by a wire bonding method.

At this time, since the back surfaces of the wire bonding portions WB of the leads 30 are flat surfaces with no protrusions P1, P2, the wire bonding portions WB of the leads 30 are not tilted, so that it is possible to reliably perform the wire bonding.

Thereafter, the lead frame 1 is detached from the stage 6 of the wire bonding device. Also, as shown in FIG. 26, the sealing resin 50 (encapsulation resin) for sealing (encapsulating) the die pad 22, the semiconductor chip 40, the metal wires 46, the leads 30 and the like of each product region R is formed over the entirety of the lead frame 1.

The sealing resin 50 is formed so that the upper surface side of the lead frame 1 is covered and the lower surfaces of the first and second external connection terminals T1, T2 coupled to the leads 30 are exposed.

Figure 27:
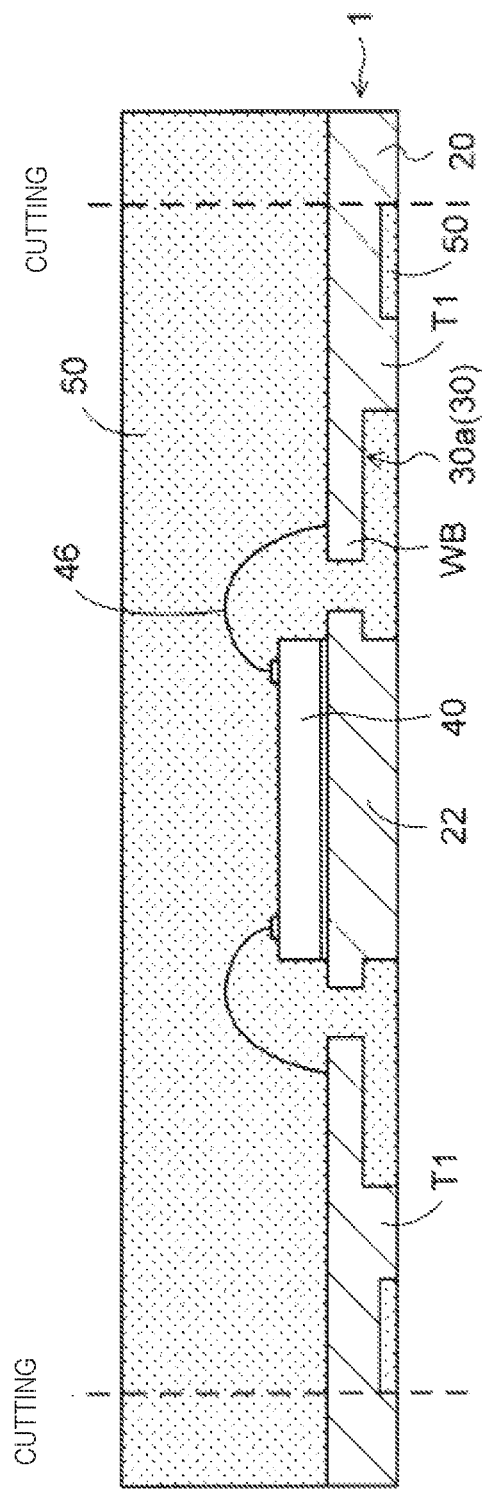
FIG. 27 is a sectional view depicting the manufacturing method of the electronic component device in which the lead frame of the exemplary embodiment is used (4 thereof).

Subsequently, as shown in FIG. 27, the sealing resin 50 and the lead frame 1 are cut for each product region R, so that the frame part 20, the outer frame part 10 and the inner frame part 12 are separated from the support bars 24 and the leads 30.

At this time, as described above, the cross-section structure of the lead 30 of the exemplary embodiment is adopted, so that the burr generation from the lead 30 is prevented.

Figure 28:
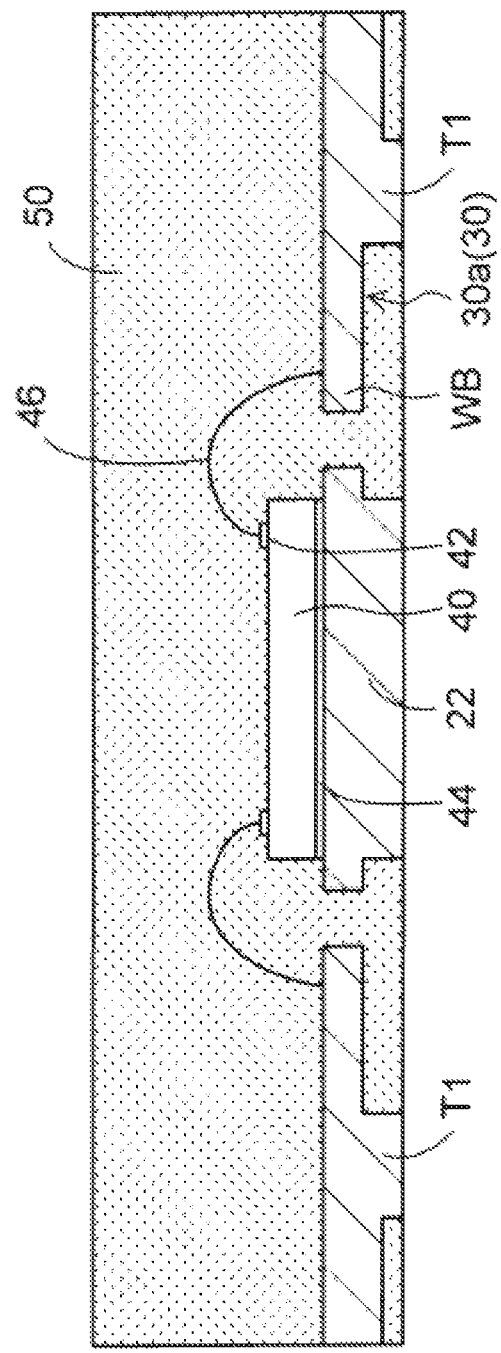
FIG. 28 is a sectional view depicting an electronic component device of the exemplary embodiment (1 thereof).

Thereby, as shown in FIG. 28, the electronic component device 2 of the exemplary embodiment is obtained. As the semiconductor chip 40, for example, a memory, a power supply controller, or an LSI chip such as a CPU is used but a variety of electronic components may be mounted.

Figure 29:
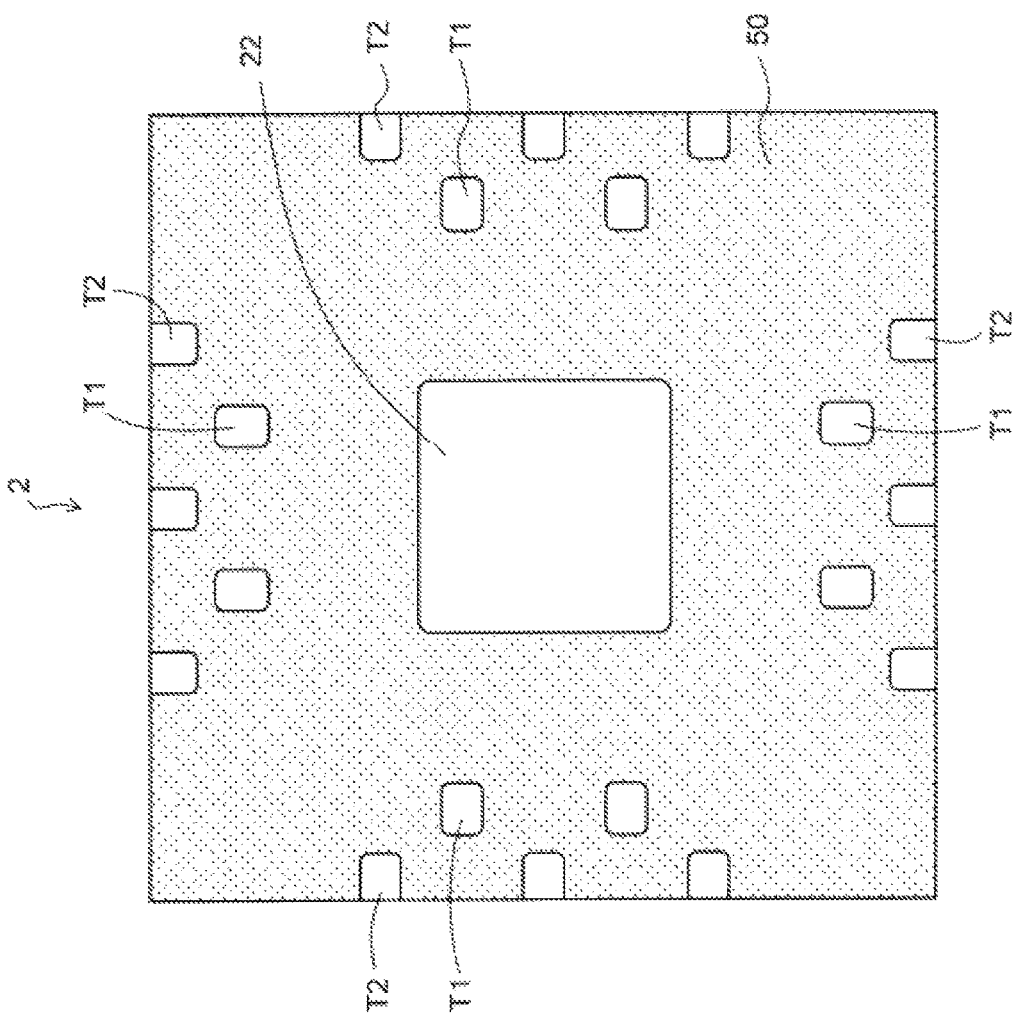
FIG. 29 is a plan view of the electronic component device of FIG. 28, as seen from a back surface side.

FIG. 29 is a plan view of the electronic component device 2 of FIG. 28, as seen from a back surface side.

As shown in FIG. 28, the electronic component device 2 of the exemplary embodiment has the die pad 22, the leads 30, the first and second external connection terminals T1, T2 obtained by cutting the lead frame 1 of FIG. 5. The back surface of the semiconductor chip 40 is bonded on the die pad 22 by the adhesive 44.

The connection pads 42 of the semiconductor chip 40 and the wire bonding portions WB of the leads 30 are connected by the metal wires 46. Also, the front surfaces/side surfaces/back surfaces of the leads 30, the die pad 22, the semiconductor chip 40 and the metal wires 46 are sealed by the sealing resin 50.

Referring to FIG. 29, the back surfaces of the first and second external connection terminals T1, T2 protruding from the back surfaces of the leads 30 are exposed from the sealing resin 50. Also, the back surface of the die pad 22 is exposed from the sealing resin 50.

Also, the first external connection terminal T1 arranged at the inner side and the second external connection terminal T2 arranged at the outer side are alternately arranged in a zigzag shape. In the example of FIG. 29, two rows of an inner row having a plurality of the first external connection terminals T1 aligned side by side and an outer row having a plurality of the second external connection terminals T2 aligned side by side are formed.

The external connection terminals may be aligned in three rows or four rows and may be aligned in any number of rows.

As described above, the lead 30 of the lead frame 1 of the exemplary embodiment has the increased strength due to the protrusion P1, P2 and the cross-sectional area thereof is adjusted so that the burr is not to be generated upon the cutting. For this reason, when the lead frame 1 of the exemplary embodiment is used, it is possible to reliably manufacture the electronic component device 2 with high yield.

Figure 30:
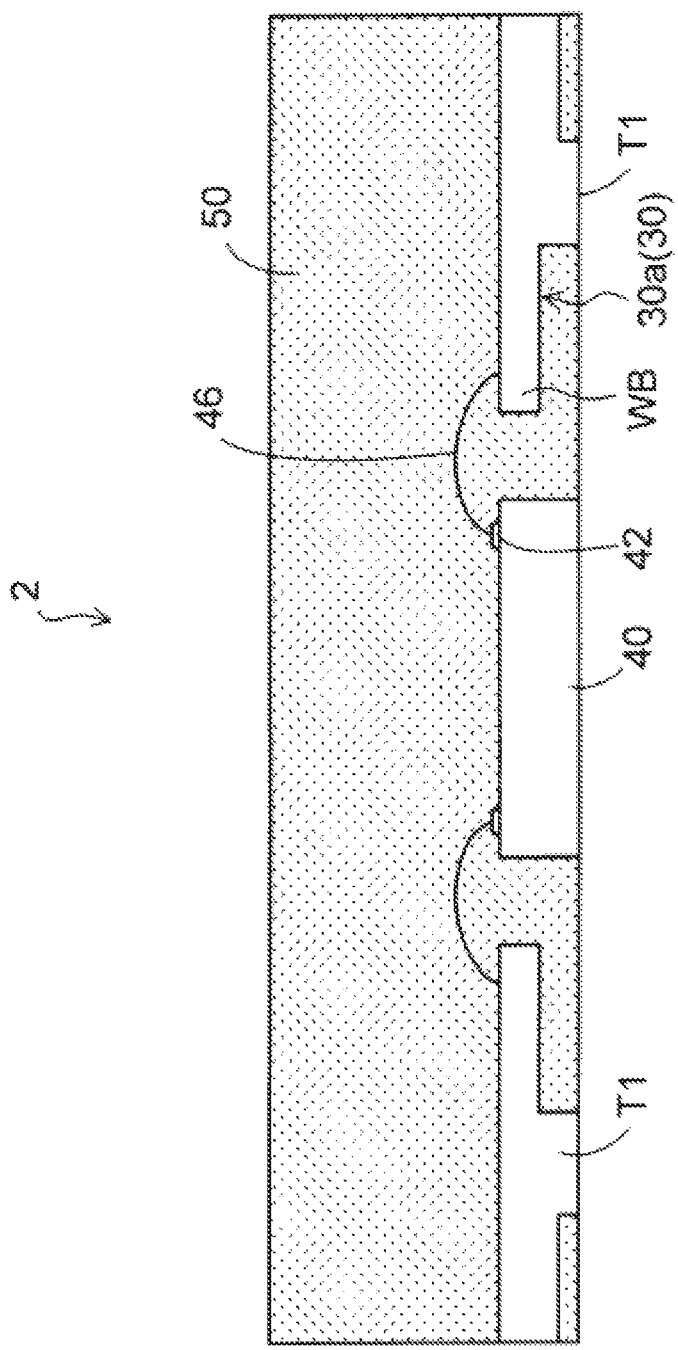
FIG. 30 is a sectional view depicting the electronic component device of the exemplary embodiment (2 thereof).

Also, as shown in FIG. 30, the die pad 22 may be omitted from the electronic component device 2 of FIG. 28. In this case, the electronic component device 2 is established so that the back surface of the semiconductor chip 40 is exposed from the sealing resin 50.

Figure 31:
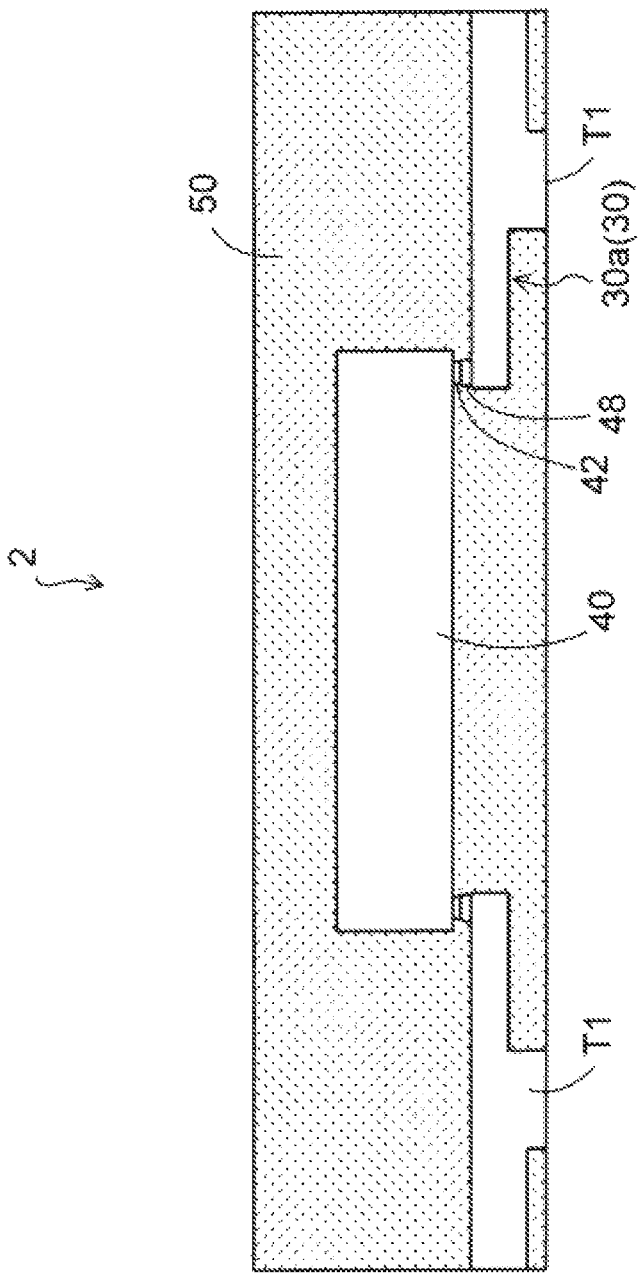
FIG. 31 is a sectional view depicting the electronic component device of the exemplary embodiment 3 thereof).

Also, as shown in FIG. 31, the electronic component device 2 may be established by flip chip-connecting the semiconductor chip 40 to the lead frame. In this case, the connection pads 42 of the semiconductor chip 40 and the upper surfaces of the leading ends of the leads 30 are connected by bump electrodes 48 such as a soldering bump, a gold bump or the like.

This disclosure further encompasses various exemplary embodiments, for example, described below.

1. A manufacturing method of a lead frame comprising:
preparing a metal plate; and
etching the metal plate to form a frame part, a lead extending inward from the frame part and having a front surface and a back surface, and an external connection terminal arranged at a part of the lead in an extension direction and protruding from the back surface of the lead,
wherein the lead includes a pentagonal shape in a cross-section where the front surface of the lead faces upward, the pentagonal shape having a quadrangular main body, part and a triangular protrusion protruding from a lower surface of the main body part, and
a width of a lower end of the main body part is set to be smaller than a width of an upper end of the main body part.

2. The manufacturing method of a lead frame according to claim 1, wherein the forming of the frame part, the lead and the external connection terminal comprises:
patterning, on a front surface of the metal plate, a first resist layer corresponding to the frame part, the lead and the external connection terminal and patterning, on a back surface of the metal plate, a second resist layer having a main pattern corresponding to the frame part and the external connection terminal and an auxiliary pattern corresponding to the protrusion of the lead; and
etching the metal plate from the front surface side and the back surface side through each opening region of the first resist layer and the second resist layer, and
wherein the lead is obtained by half etching the metal plate from the back surface side, and the frame part and the external connection terminal are obtained by penetrating the metal plate from the front surface side and the back surface side.

3. The manufacturing method of a lead frame according to claim 2, wherein the auxiliary pattern of the second resist layer has a plurality of hole portions arranged therein.

4. The manufacturing method of a lead frame according to one of claims 1 to 3, wherein in the forming of the frame part, the lead and the external connection terminal, the protrusion of the lead and the external connection terminal are arranged with being spaced from each other.

5. The manufacturing method of a lead frame according to one of claims 1 to 3, wherein the forming of the frame part, the lead and the external connection terminal comprises:
forming a coupling part via which the protrusion of the lead and the external connection terminal are coupled to each other, and
wherein a width of the coupling part is set to be larger than a width of the protrusion and a height of the coupling part is set to be lower than a height of the external connection terminal.

What is claimed is:

1. A lead frame comprising:
a frame part;
a lead extending inward from the frame part and having a front surface and a back surface; and
an external connection terminal formed at a part of the lead in an extension direction and protruding from the back surface of the lead,
wherein the lead includes a pentagonal shape in a cross-section where the front surface of the lead faces upward, the pentagonal shape having a quadrangular main body part and a triangular protrusion protruding from a lower surface of the main body part, and the external connection terminal is directly coupled at one end side to the frame part, and the protrusion is formed at the lead in an inner region extending inwardly relative to the frame part from another end side of the external connection terminal opposite to the one end side directly coupled to the frame part toward a tip end of the lead disposed distally relative to the frame part.

2. The lead frame according to claim 1, wherein the protrusion of the lead and the external connection terminal are coupled to each other via a coupling part, and
wherein a width of the coupling part is larger than a width of the protrusion and a height of the coupling part is lower than a height of the external connection terminal.

3. The lead frame according to claim 1, wherein the lead includes, at the tip end, a connection part to be connected with a semiconductor chip and the protrusion is formed in a region except for the connection part of the lead.

4. The lead frame according to claim 1, wherein a width of a lower end of the main body part is smaller than a width of an upper end of the main body part.

5. The lead frame according to claim 1, wherein the frame part has a rectangular shape, a die pad is provided inside the rectangular shape of the frame part, and the tip end of the lead faces the die pad.

6. The lead frame according to claim 1, further comprising:
a second lead extending inward from the frame part and having a front surface and a back surface; and a second external connection terminal formed at a part of the second lead in an extension direction of the second lead and protruding from the back surface of the second lead, wherein the second lead includes a pentagonal shape in a cross-section where the front surface of the second lead faces upward, the pentagonal shape of the second lead having a quadrangular main body part and a triangular protrusion protruding from a lower surface of the main body part, the second external connection terminal is disposed at a middle of the second lead spaced from a tip end of the second lead and the frame part in an extension direction of the second lead from the frame part, the tip end of the second lead disposed distally relative to the frame part, the protrusion of the second lead is disposed only between the frame part and the second external connection terminal.

7. The lead frame according to claim 1, further comprising:

a second lead extending inward from the frame part and having a front surface and a back surface; and a second external connection terminal formed at a part of the second lead in an extension direction and protruding from the back surface of the second lead, wherein the second lead includes a pentagonal shape in a cross-section where the front surface of the second lead faces upward, the pentagonal shape of the second lead having a quadrangular main body part and a triangular protrusion protruding from a lower surface of the main body part, the second external connection terminal is disposed at a middle of the second lead spaced from a tip end of the second lead and the frame part in an extension direction of the second lead from the frame part, the tip end of the second lead disposed distally relative to the frame part, the protrusion of the second lead is disposed between the frame part and the second external connection terminal and between the second external connection terminal and the tip end of the second lead.

8. A lead frame comprising:

a frame part;

a lead extending inward from the frame part and having a front surface and a back surface; and an external connection terminal formed at a part of the lead in an extension direction and protruding from the back surface of the lead, wherein the lead includes a pentagonal shape in a cross-section where the front surface of the lead faces upward, the pentagonal shape having a quadrangular main body part and a triangular protrusion protruding from a lower surface of the main body part, and the protrusion of the lead and the external connection terminal are spaced from each other with an interval of the lead disposed therebetween, the interval of the lead being separate from and exclusive of the protrusion and the external connection terminal.

9. The lead frame according to claim 8, wherein the external connection terminal is arranged at a middle of the lead in the extension direction spaced from the frame part and the tip end, and wherein the protrusion is formed at the lead in a region between the frame part and the external connection terminal.

10. The lead frame according to claim 8, wherein the external connection terminal is directly coupled at one end side to the frame part, and wherein the protrusion is formed at the lead in an inner region extending inwardly relative to the frame part from another end side of the external connection terminal opposite to the one end side directly coupled to the frame part toward a tip end of the lead disposed distally relative to the frame part.

11. The lead frame according to claim 8, wherein the protrusion is formed at the lead in an inner region extending inwardly relative to the frame part from the external connection terminal toward a tip end of the lead disposed distally relative to the frame part.

12. The lead frame according to claim 8, wherein the lead includes, at a tip end disposed distally relative to the frame part, a connection part to be connected with a semiconductor chip and the protrusion is formed in a region except for the connection part of the lead.

13. The lead frame according to claim 8, wherein a width of a lower end of the main body part is smaller than a width of an upper end of the main body part.

14. The lead frame according to claim 8, wherein the frame part has a rectangular shape, a die pad is provided inside the rectangular shape of the frame part, and a tip end of the lead disposed distally relative to the frame part faces the die pad.

15. A lead frame comprising:

a frame part;

a lead extending inward from the frame part and having a front surface and a back surface; and an external connection terminal formed at a part of the lead in an extension direction and protruding from the back surface of the lead, wherein the lead includes a pentagonal shape in a cross-section where the front surface of the lead faces upward, the pentagonal shape having a quadrangular main body part and a triangular protrusion protruding from a lower surface of the main body part, and the protrusion is formed at the lead in an inner region extending inwardly relative to the frame part from the external connection terminal toward a tip end of the lead disposed distally relative to the frame part.

16. The lead frame according to claim 15, wherein the external connection terminal is arranged at a middle of the lead in the extension direction spaced from the frame part and the tip end, and wherein the protrusion is also formed at the lead in a region between the frame part and the external connection terminal.

17. The lead frame according to claim 15, wherein the protrusion of the lead and the external connection terminal are coupled to each other via a coupling part, and wherein a width of the coupling part is larger than a width of the protrusion and a height of the coupling part is lower than a height of the external connection terminal.

18. The lead frame according to claim 15, wherein the lead includes, at the tip end, a connection part to be connected with a semiconductor chip and the protrusion is formed in a region except for the connection part of the lead.

19. The lead frame according to claim 15, wherein a width of a lower end of the main body part is smaller than a width of an upper end of the main body part.

20. The lead frame according to claim 15, wherein the frame part has a rectangular shape, a die pad is provided inside the rectangular shape of the frame part, and the tip end of the lead faces the die pad.

* * * * *